United States Patent
Song et al.

(10) Patent No.: US 12,495,580 B2
(45) Date of Patent: Dec. 9, 2025

(54) SEMICONDUCTOR DEVICE

(71) Applicant: SAMSUNG ELECTRONICS CO., LTD., Suwon-si (KR)

(72) Inventors: Seungmin Song, Suwon-si (KR); Myungil Kang, Suwon-si (KR); Hyojin Kim, Suwon-si (KR); Doyoung Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 299 days.

(21) Appl. No.: 18/195,657

(22) Filed: May 10, 2023

(65) Prior Publication Data
US 2024/0014284 A1   Jan. 11, 2024

(30) Foreign Application Priority Data

Jul. 6, 2022   (KR) ........................ 10-2022-0083050

(51) Int. Cl.
| | |
|---|---|
| H10D 30/67 | (2025.01) |
| H01L 23/528 | (2006.01) |
| H10D 30/43 | (2025.01) |
| H10D 62/10 | (2025.01) |
| H10D 64/23 | (2025.01) |
| H10D 84/85 | (2025.01) |

(52) U.S. Cl.
CPC ..... *H10D 30/6735* (2025.01); *H01L 23/5283* (2013.01); *H10D 30/43* (2025.01); *H10D 30/6757* (2025.01); *H10D 62/121* (2025.01); *H10D 64/258* (2025.01); *H10D 84/85* (2025.01)

(58) Field of Classification Search
CPC .. H10D 30/6735; H10D 64/017; H10D 30/62; H10D 84/853
See application file for complete search history.

(56) References Cited

U.S. PATENT DOCUMENTS

| | | |
|---|---|---|
| 10,269,914 B2 | 4/2019 | Wu et al. |
| 10,833,078 B2 | 11/2020 | Smith et al. |
| 11,201,153 B2 | 12/2021 | Xie et al. |
| 11,239,232 B2 | 2/2022 | Lilak et al. |

(Continued)

FOREIGN PATENT DOCUMENTS

| | | |
|---|---|---|
| KR | 1020200121740 A | 10/2020 |
| KR | 1020220044634 A | 4/2022 |

*Primary Examiner* — Allison Bernstein
(74) *Attorney, Agent, or Firm* — Muir Patent Law, PLLC

(57) ABSTRACT

A semiconductor device includes an active region on a substrate; channel layers on the active region spaced apart from each other and including lower and upper channel layers; an intermediate insulating layer between an uppermost lower channel layer and a lowermost upper channel layer; a gate intersecting the active region and including a lower gate electrode surrounding the lower channel layers and an upper gate electrode surrounding the upper channel layers; an insulating pattern between the upper and lower gate electrodes on a side of the intermediate insulating layer; source/drain regions on at least one side of the gate, and including lower source/drain regions connected to the lower channel layers and upper source/drain regions connected to the upper channel layers; and a contact plug including a horizontal extension portion connected to the lower source/drain regions, and a vertical extension portion connected to the horizontal extension portion.

20 Claims, 23 Drawing Sheets

(56) References Cited

U.S. PATENT DOCUMENTS

| | | |
|---|---|---|
| 2020/0105751 A1 | 4/2020 | Dewey et al. |
| 2020/0328212 A1 | 10/2020 | Wu et al. |
| 2021/0320035 A1 | 10/2021 | Xie et al. |
| 2022/0157853 A1 | 5/2022 | Cho et al. |
| 2023/0095830 A1* | 3/2023 | Kim ................ H10D 84/143 257/288 |
| 2024/0145544 A1* | 5/2024 | Kim ................ H10D 62/151 |
| 2024/0243172 A1* | 7/2024 | Baek ................ H01L 25/074 |
| 2024/0387552 A1* | 11/2024 | Lee ................ H10D 88/01 |

* cited by examiner

SEMICONDUCTOR DEVICE

CROSS-REFERENCE TO RELATED APPLICATION(S)

This application claims benefit of priority to Korean Patent Application No. 10-2022-0083050, filed on Jul. 6, 2022, in the Korean Intellectual Property Office, the disclosure of which is incorporated herein by reference in its entirety.

BACKGROUND

1. Field

Embodiments relate to a semiconductor device.

2. Description of the Related Art

As the demand for high performance, high speed, and/or multifunctionality of semiconductor devices increases, a degree of integration of semiconductor devices is increasing. In order to overcome the limitation of operating characteristics due to a reduction in the size of a planar metal oxide semiconductor field effect transistor (FET), efforts are being made to develop semiconductor devices including FinFETs having fin-shaped channels, gate-all-around field effect transistors (GAAFETs) with nanosheets surrounded by gates, or the like.

SUMMARY

According to an aspect of embodiments, a semiconductor device includes an active region extending on a substrate in a first horizontal direction; a plurality of channel layers stacked on the active region spaced apart from each other, the plurality of channel layers including lower channel layers and upper channel layers on the lower channel layers; an intermediate insulating layer between an uppermost lower channel layer of the lower channel layers and a lowermost upper channel layer of the upper channel layers; a gate structure intersecting the active region and the plurality of channel layers on the substrate, extending in a second horizontal direction, and including a gate electrode surrounding the plurality of channel layers, the gate electrode including a lower gate electrode surrounding the lower channel layers and an upper gate electrode surrounding the upper channel layers; an insulating pattern between the upper gate electrode and the lower gate electrode on a first side of the intermediate insulating layer in the second horizontal direction; source/drain regions on at least one side of the gate structure, and including lower source/drain regions connected to the lower channel layers and upper source/drain regions connected to the upper channel layers on the lower source/drain regions; and a contact plug including a horizontal extension portion connected to each of the lower source/drain regions and extending in a horizontal direction, parallel to the substrate, and a vertical extension portion connected to the horizontal extension portion and extending in a vertical direction, perpendicular to an upper surface of the substrate.

According to an aspect of embodiments, a semiconductor device includes active regions extending parallel to each other on a substrate in a first horizontal direction; a plurality of transistor structures spaced apart from each other on the substrate in a second horizontal direction; and gate isolation patterns physically separating the plurality of transistor structures, wherein a first transistor structure of the plurality of transistor structures includes first channel layers spaced apart from each other and stacked on a first active region of the active regions, the first channel layers including lower channel layers and upper channel layers on the lower channel layers; a first intermediate insulating layer between an uppermost lower channel layer of the lower channel layers and a lowermost upper channel layer of the upper channel layers; a first gate structure intersecting the first active region and the first channel layers on the substrate, extending in the second horizontal direction, and including a first gate electrode surrounding the first channel layers; a first insulating pattern between the first side of the first intermediate insulating layer in the second horizontal direction and the gate isolation patterns; and first source/drain regions on at least one side of the first gate structure, and including lower source/drain regions connected to the lower channel layers and upper source/drain regions connected to the upper channel layers on the lower source/drain regions.

According to an aspect of embodiments, a semiconductor device includes an active region extending on a substrate in a first horizontal direction; a plurality of channel layers stacked on the active region to be spaced apart from each other, the plurality of channel layers including lower channel layers and upper channel layers on the lower channel layers; a gate structure intersecting the active region and the plurality of channel layers on the substrate, extending in a second horizontal direction, and including a gate electrode surrounding the plurality of channel layers, the gate electrode including a lower gate electrode surrounding the lower channel layers and an upper gate electrode surrounding the upper channel layers; an insulating pattern between the upper gate electrode and the lower gate electrode; source/drain regions on at least one side of the gate structure, and including lower source/drain regions connected to the lower channel layers and upper source/drain regions connected to the upper channel layers on the lower source/drain regions; and a contact plug including a vertical extension portion connected to the horizontal extension portion and extending in a vertical direction, perpendicular to an upper surface of the substrate, and a horizontal extension portion connected to each of the lower source/drain regions and extending in a horizontal direction, parallel to the substrate, wherein the lower gate electrode has a portion contacting the upper gate electrode, the insulation pattern does not overlap the plurality of channel layers in the vertical direction, and at least a portion of the insulation pattern is at a level, equal to a level of at least a portion of the horizontal extension portion.

BRIEF DESCRIPTION OF DRAWINGS

Features will become apparent to those of skill in the art by describing in detail exemplary embodiments with reference to the attached drawings, in which.

DETAILED DESCRIPTION

Figure 1:
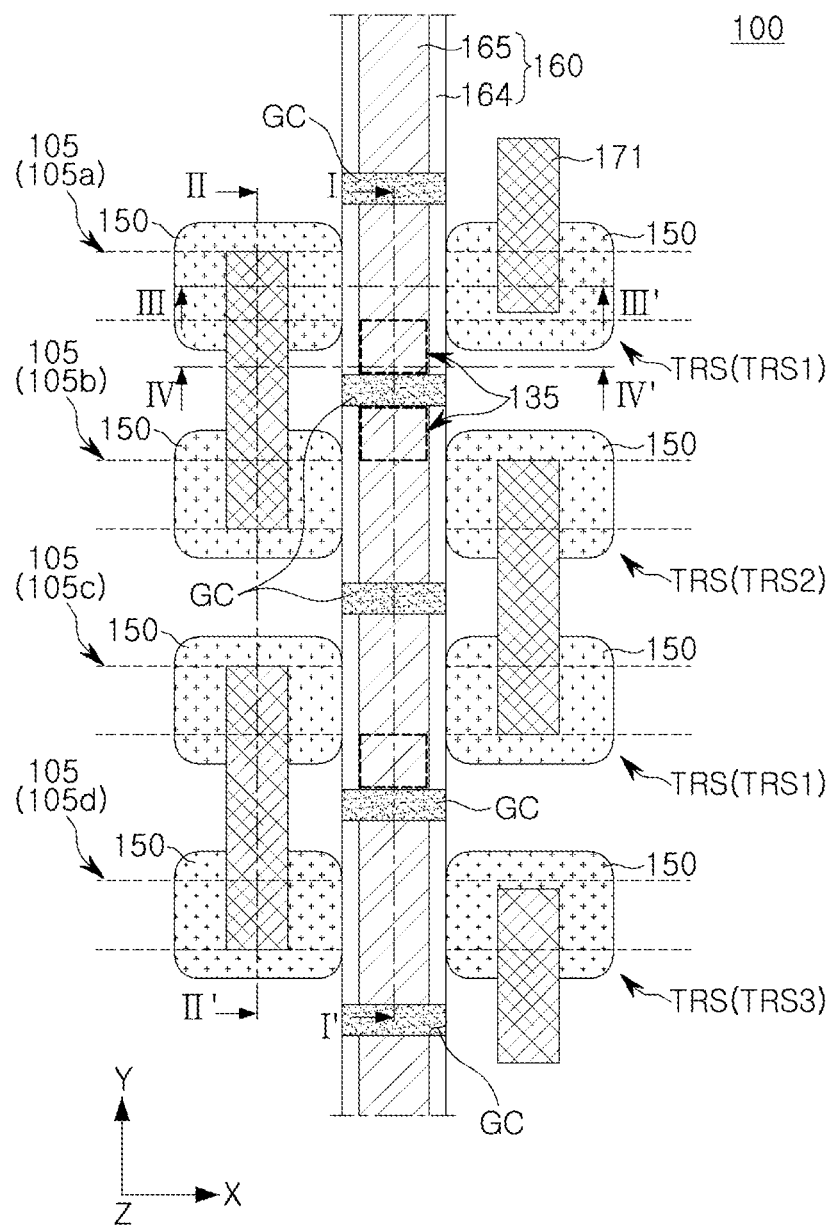
FIG. 1 is a plan view illustrating a semiconductor device according to example embodiments.
Figure 2A:
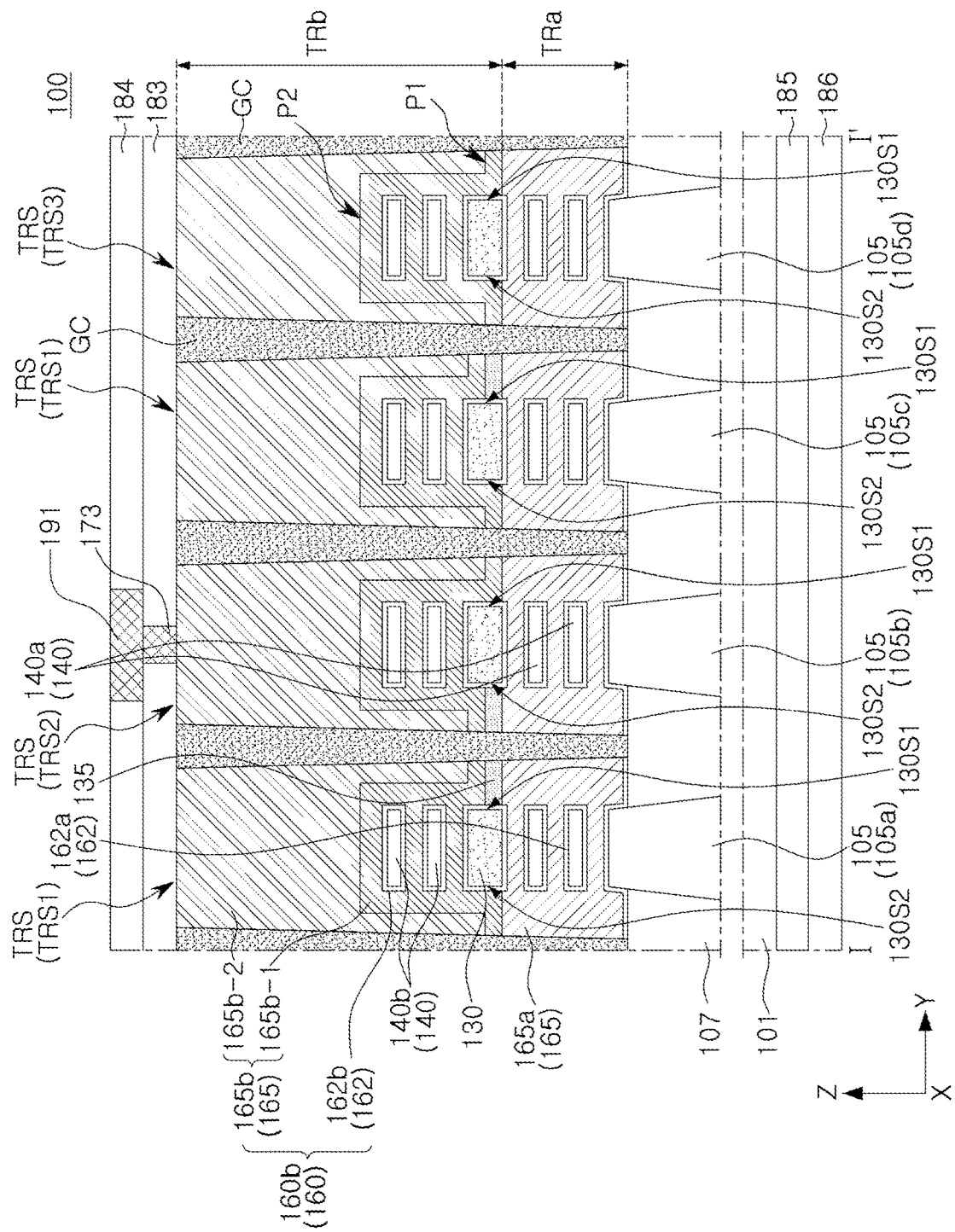
FIGS. 2A to 2C are cross-sectional views illustrating a semiconductor device according to example embodiments.
Figure 2B:
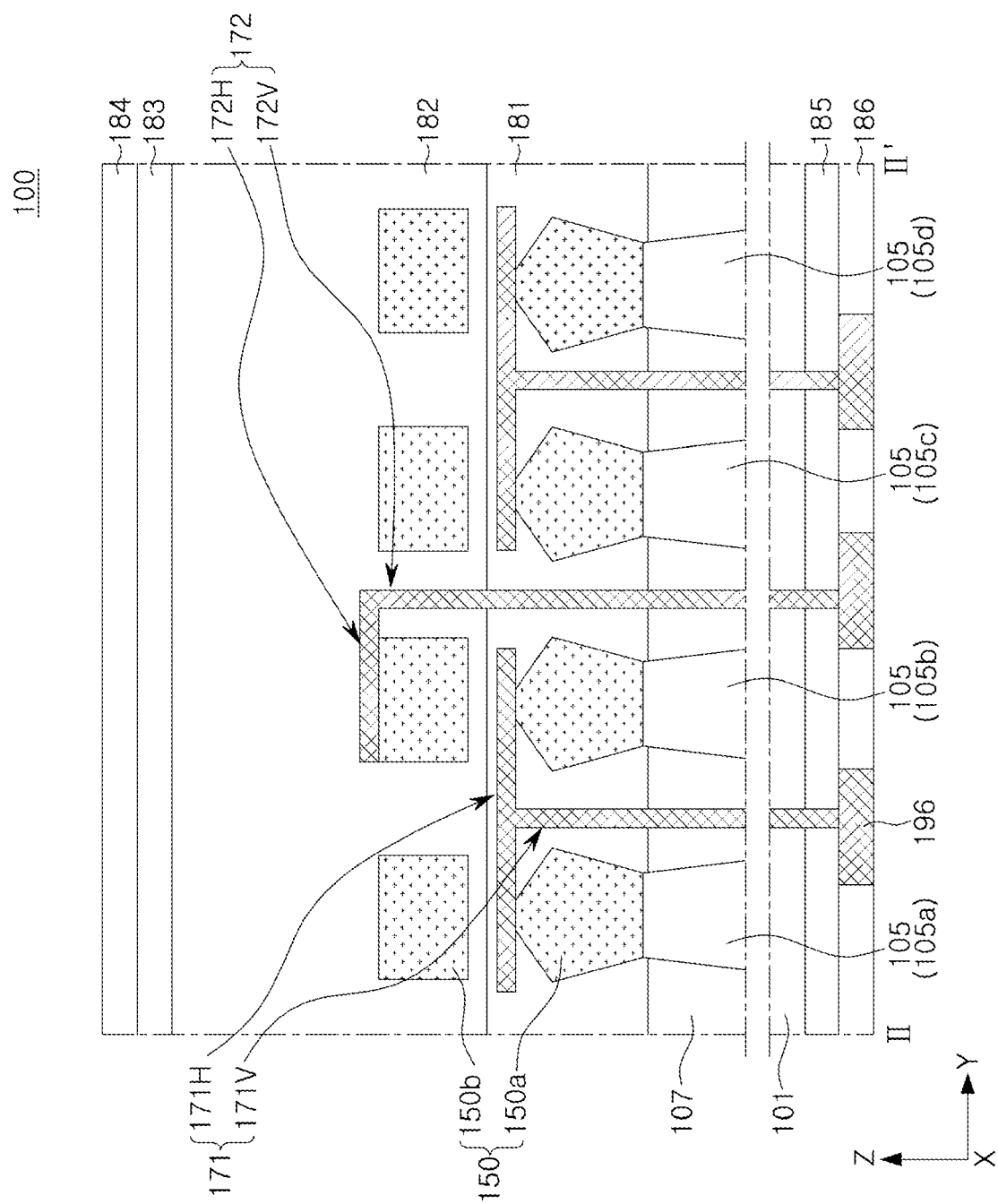
Figure 2C:
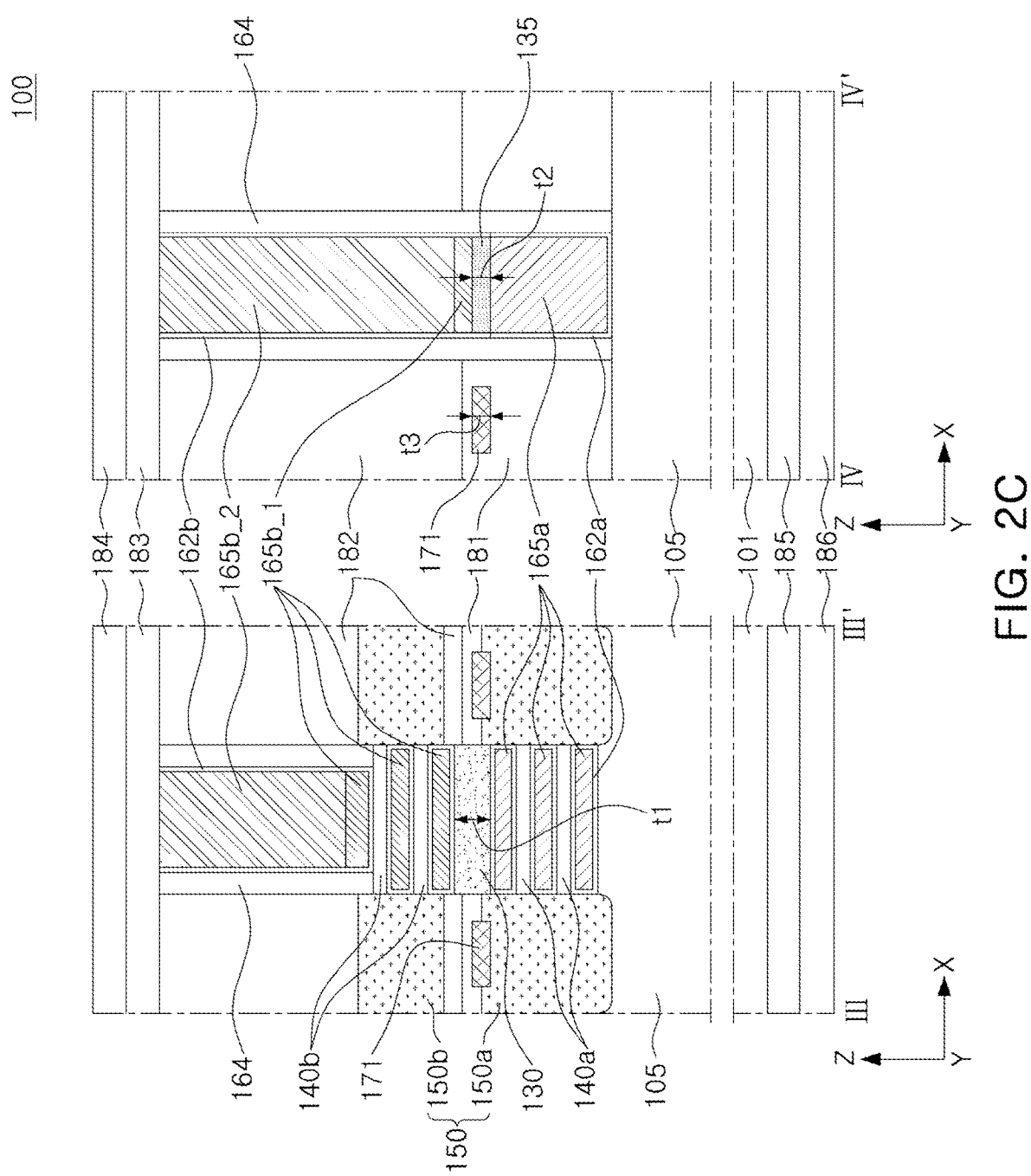

FIG. 1 is a plan view illustrating a semiconductor device according to example embodiments. FIGS. 2A, 2B, and 2C are cross-sectional views illustrating cross-sections along lines I-I', II-II' and III-III' and IV-IV' of FIG. 1, respectively.

Referring to FIGS. 1 to 2C, a semiconductor device 100 may include a substrate 101, active regions 105 on the substrate 101, a plurality of transistor structures TRS on the substrate 101, and gate isolation patterns GC separating the plurality of transistor structures TRS from each other.

Each of the plurality of transistor structures TRS may include a lower transistor TRa and an upper transistor TRb disposed on the lower transistor TRa. The upper and lower transistors TRa and TRb may be stacked vertically in a Z-direction, and may provide a complementary FET (CFET). The upper and lower transistors TRa and TRb may provide an NMOSFET-on-PMOSFET or a PMOSFET-on-NMOSFET. In another example, the semiconductor device 100 may stack the transistor structures TRS to provide a CMOSFET-on-CMOSFET.

In an example embodiment, the plurality of transistor structures TRS may include first to third transistor structures TRS1, TRS2, and TRS3. In this specification, the second and third transistor structures TRS2 and TRS3 may have the same or similar characteristics as the first transistor structure TRS1, unless otherwise specified, and the first transistor structure TRS1 may also be referred to as a 'transistor structure.'

The transistor structure TRS1 may include a plurality of channel layers 140 stacked and spaced apart from each other in the Z-direction on the active regions 105, a gate structure 160 intersecting the active regions 105 and the plurality of channel layers 140 and extending in a Y-direction, and source/drain regions 150 connected to the plurality of channel layers 140 on both sides of the gate structure 160. The gate structure 160 may include a gate dielectric layer 162, a gate electrode 165, and a gate spacer 164.

The lower transistor TRa of the transistor structure TRS1 may include lower channel layers 140a, a lower gate electrode 165a surrounding the lower channel layers 140a, lower source/drain regions 150a connected to the layers 140a on both sides of the lower gate electrode 165a, and a lower gate dielectric layer 162a between the lower channel layers 140a and the lower gate electrode 165a.

The upper transistor TRb of the transistor structure TRS1 may include upper channel layers 140b, an upper gate electrode 165b surrounding the upper channel layers 140b, upper source/drain regions 150b connected to the layers 140b on both sides of the upper gate electrode 165b, and an upper gate dielectric layer 162b between the upper channel layers 140b and the upper gate electrode 165b.

In an example embodiment, the transistor structure TRS1 may further include an intermediate insulating layer 130 between the upper and lower transistors TRa and TRb, and an insulating pattern 135 disposed on one side of the intermediate insulating layer 130. The transistor structure TRS1 may have a common gate electrode structure in which the upper and lower gate electrodes 165a and 165b are connected in a region in which the intermediate insulating layer 130 and the insulating pattern 135 are not disposed.

The semiconductor device 100 may further include a device isolation layer 107, contact plugs 171, 172, and 173, upper interconnections 191, lower interconnections 196, and interlayer insulating layers 181, 182, 183, 184, 185 and 186.

In the semiconductor device 100, the active regions 105 may have a fin structure, and the gate electrode 165 may be disposed to surround the plurality of channel layers 140. Therefore, the semiconductor device 100 may provide a multi-bridge-channel FET (MBCFET™).

The substrate 101 may include a semiconductor material, e.g., a group IV semiconductor, a group III-V compound semiconductor, or a group II-VI compound semiconductor. For example, the group IV semiconductor may include silicon (Si), germanium (Ge), or silicon germanium (SiGe). The substrate 101 may be provided as, e.g., a bulk wafer, an epitaxial layer, a silicon-on-insulator (SOI) layer, a semiconductor-on-insulator (SeOI) layer, or the like.

The active regions 105 may be defined by the device isolation layer 107 on the substrate 101, and may be disposed to extend lengthwise in a first horizontal direction, e.g., an X-direction. The active regions 105 may have a structure protruding from the substrate 101. Upper ends of the active regions 105 may be disposed to protrude from, e.g., above, an upper surface of the device isolation layer 107 by a predetermined height. The active regions 105 may be formed as a portion of the substrate 101, or may include an epitaxial layer grown from the substrate 101. However, on both sides of the gate structure 160, the active regions 105 on the substrate 101 may be partially recessed, and the lower source/drain regions 150a may be disposed on the recessed active regions 105. According to embodiments, the active regions 105 may include impurities.

A plurality of active regions 105 may be disposed to be spaced apart from each other in a second direction, e.g., the Y-direction. In an example embodiment, the active regions 105 may include first to fourth active regions 105a, 105b, 105c, and 105d sequentially arranged in the Y-direction.

The device isolation layer 107 may define active regions 105 on the substrate 101. The device isolation layer 107 may be formed by, e.g., a shallow trench isolation (STI) process. The device isolation layer 107 may expose upper side surfaces of the active regions 105. The device isolation layer 107 may extend lengthwise in the X-direction, and may cover side surfaces below the exposed upper side surfaces of the active regions 105. According to embodiments, the device isolation layer 107 may include a region extending deeper below the substrate 101 between the active regions 105. The device isolation layer 107 may have a curved upper surface having a higher level as it approaches the active regions 105, but a shape of an upper surface of the device isolation layer 107 is not limited thereto. The device isolation layer 107 may be formed of an insulating material. The device isolation layer 107 may be formed of, e.g., silicon oxide, silicon nitride, silicon oxynitride, or a combination thereof.

The plurality of channel layers 140 may be stacked on the active regions 105 while being spaced apart from each other in a direction, perpendicular to an upper surface of the substrate 101, e.g., in the Z-direction, and may include lower channel layers 140a and upper channel layers 140b on the lower channel layers 140a.

The lower channel layers 140a may be connected to the lower source/drain regions 150a. The lower channel layers 140a may include a plurality of semiconductor layers spaced apart from each other in the Z-direction on the active regions

105. In FIGS. 2A and 2C, the number of the plurality of semiconductor layers is illustrated as being two, but the number of semiconductor layers is not limited thereto, and may be variously changed. The plurality of semiconductor layers may be formed of a semiconductor material, e.g., at least one of silicon (Si), silicon germanium (SiGe), or germanium (Ge).

The upper channel layers 140*b* may be connected to the upper source/drain regions 150*b*. The upper channel layers 140*b* may be disposed on the lower channel layers 140*a*, and may vertically overlap the lower channel layers 140*a*. The upper channel layers 140*b* may include a plurality of semiconductor layers spaced apart from each other in the Z-direction. In FIGS. 2A and 2C, the number of the plurality of semiconductor layers is illustrated as being two, but the number of semiconductor layers is not limited thereto and may be variously changed. The plurality of semiconductor layers constituting the upper channel layers 140*b* may be formed of a semiconductor material, e.g., at least one of silicon (Si), silicon germanium (SiGe), or germanium (Ge).

In an example embodiment, at least one of the upper channel layers 140*a* or the lower channel layers 140*b* may include a semiconductor layer including impurities.

The gate structure 160 may extend on the active regions 105 and the device isolation layer 107 in the Z-direction. The gate structure 160 may include a gate electrode 165 extending, e.g., lengthwise, in the second horizontal direction, e.g., the Y-direction, while surrounding the plurality of channel layers 140, a gate dielectric layer 162 between the gate electrode 165 and the plurality of channel layers 140, and gate spacers 164 disposed on opposite, e.g., both, sides of the gate electrode 165. For example, the gate structure 160 may further include a gate capping layer disposed on an upper surface of the gate electrode 165 and an upper surface of the gate spacer 164.

The gate electrode 165 may include a lower gate electrode 165*a* of the lower transistor TRa and an upper gate electrode 165*b* of the upper transistor TRb.

The lower gate electrode 165*a* may intersect the active regions 105 and the lower channel layers 140*a* on the active regions 105, and may extend, e.g., lengthwise, in the second direction, e.g., the Y-direction. A channel region of the lower transistor TRa may be formed in the active regions 105 and the lower channel layers 140*a*, intersecting the lower gate electrode 165*a*. The lower gate electrode 165*a* may surround the lower channel layers 140*a*, and a lower gate dielectric layer 162*a* may be disposed between the lower gate electrode 165*a* and the lower channel layers 140*a*.

The upper gate electrode 165*b* may intersect the upper channel layers 140*b* on the lower channel layers 140*a*, and may extend, e.g., lengthwise, in the Y-direction. A channel region of the upper transistor may be formed in the upper channel layers 140*b* intersecting the upper gate electrode 165*b*. The upper gate electrode 165*b* may surround the upper channel layers 140*b*, and an upper gate dielectric layer 162*b* may be disposed between the upper gate electrode 165*b* and the upper channel layers 140*b*.

The gate electrode 165 may include a conductive material, e.g., at least one of W, Ti, Ta, Mo, TiN, TaN, WN, TiON, TiAlC, TiAlN, or TaAlC. According to embodiments, the gate electrode 165 may include a semiconductor material, e.g., doped polysilicon.

For example, the upper and lower gate electrodes 165*a* and 165*b* may include different materials. At least one of the upper gate electrode 165*a* or the lower gate electrode 165*b* may be formed of two or more multi-layers. In an example embodiment, the upper gate electrode 165*b* may include a first upper gate electrode 165*b*_1 surrounding the upper channel layers 140*b* and a second upper gate electrode 165*b*_2 on the first upper gate electrode 165*b*_1. The first and second upper gate electrodes 165*b*_1 and 165*b*_2 may include different materials, or even when they include the same material, a boundary may be distinguished according to process conditions.

In an example embodiment, the first upper gate electrode 165*b*_1 may include a first portion P1 covering an upper surface of the insulating pattern 135 and an upper surface of the lower gate electrode 165*a*, and a second portion P2 covering the upper channel layers 140*b*. For example, as illustrated in FIG. 2A, the first portion P1 may be horizontal, e.g., extend lengthwise in the second direction and in parallel to the upper surface of the substrate 101, and the second portion P2 may extend vertically from the first portion P1 and include both vertical and horizontal portions that surround the upper channel layers 140*b*. An upper surface of the first portion P1 may be located at a level lower than a level of an upper surface of the second portion P2, e.g., relative to the upper surface of the substrate 101. The second upper gate electrode 165*b*_2 may extend between the second portion P2 and the gate isolation patterns GC to contact the first portion P1. For example, as illustrated in FIG. 2A, the second upper gate electrode 165*b*_2 may, e.g., continuously, extend and be in direct contact with upper and lateral surfaces of the second portion P2, lateral surfaces of the gate isolation patterns GC, and the upper surface of the first portion P1.

The gate dielectric layers 162 may include a lower gate dielectric layer 162*a* of the lower transistor TRa and an upper gate dielectric layer 162*b* of the upper transistor TRb. The gate dielectric layers 162 may include, e.g., an oxide, a nitride, and/or a high-K material. The high-κ material may refer to a dielectric material having a higher dielectric constant than that of a silicon oxide layer ($SiO_2$). The high dielectric constant material may be at least one of, e.g., aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), and praseodymium oxide ($Pr_2O_3$). For example, the upper and lower gate dielectric layers 162*a* and 162*b* may include different materials, but is not limited thereto.

The gate spacers 164 may be disposed on both side surfaces of the gate structure 160. In example embodiments, the gate spacers 164 may include portions having a curved outer surface such that a width of an upper portion in each of the gate spacers 164 is narrower than a width of a lower portion. The gate spacers 164 may have a multi-layer structure according to example embodiments. The gate spacers 164 may include at least one of, e.g., silicon oxide, silicon nitride, and silicon oxynitride.

The source/drain regions 150 may include lower source/drain regions 150*a* of the lower transistor TRa and upper source/drain regions 150*b* of the upper transistor TRb.

The lower source/drain regions 150*a* may be disposed on recessed regions of the active regions 105 on both sides of the lower channel layers 140*a*. The lower source/drain regions 150*a* may serve as a source region or a drain region of the lower transistor TRa. The lower source/drain regions 150*a* may be disposed by partially recessing upper portions of the active regions 105, but in embodiments, the presence or absence of a recess and a depth of the recess may be variously changed.

The upper source/drain regions 150b may be disposed on both sides of the upper channel layers 140b. The upper source/drain regions 150b may serve as a source region or a drain region of the upper transistor TRb. The upper source/drain regions 150b may be spaced apart from the lower source/drain regions 150a. For example, as illustrated in FIG. 2B, the upper source/drain regions 150b may be separated from the lower source/drain regions 150a by the first interlayer insulating layer 181 and/or the second interlayer insulating layer 182. In another example, the upper source/drain regions 150b may be separated from the lower source/drain regions 150a by a separate insulating structure.

The source/drain regions 150a and 150b may include a semiconductor layer including silicon (Si), and may include a plurality of epitaxial layers. The source/drain regions 150a and 150b may include impurities of different types and/or concentrations. For example, when the lower transistor TRa is a PMOSFET, the lower source/drain regions 150a may include p-type doped silicon germanium (SiGe), and when the upper transistor TRb is an NMOSFET, the upper source/drain regions 150b may include n-type doped silicon (Si).

The intermediate insulating layer 130 may be disposed between an uppermost lower channel layer 140a of the lower channel layers 140a and a lowermost upper channel layer 140b of the upper channel layers 140b. The intermediate insulating layer 130 may be disposed on the active regions 105, e.g., the intermediate insulating layer 130 may vertically overlap an upper surface of the active regions 105. In an example embodiment, the entire intermediate insulating layer 130 may vertically overlap the gate structure 160, but may include a portion not vertically overlapping the gate structure 160, according to embodiments.

In an example embodiment, at least a portion of the intermediate insulating layer 130 may be covered by the gate dielectric layer 162. The intermediate insulating layer 130 may be spaced apart from the upper and lower gate electrodes 165a and 165b, e.g., by the gate dielectric layer 162.

The intermediate insulating layer 130 may include an insulating material, e.g., at least one of silicon nitride, silicon oxynitride, and silicon carbonitride. The intermediate insulating layer 130 may be a single insulating material layer or a multi material layer.

The insulating pattern 135 may be disposed on one side of the intermediate insulating layer 130 between the upper gate electrode 165b and the lower gate electrode 165a. For example, the insulating pattern 135 may be between the first portion P1 of the upper gate electrode 165b and the lower gate electrode 165a, e.g., the insulating pattern 135 and the first portion P1 may completely overlap each other and contact (e.g., abut) a lateral side of the intermediate insulating layer 130. The insulating pattern 135 may be disposed between the one side of the intermediate insulating layer 130 and the gate isolation patterns GC. For example, the insulating pattern 135 may be in contact with the gate isolation patterns GC. The insulating pattern 135 may not overlap the plurality of channel layers 140 in the Z-direction.

An upper surface of the insulating pattern 135 may be in, e.g., direct, contact with the upper gate electrode 165b, and a lower surface of the insulating pattern 135 may be in, e.g., direct, contact with the lower gate electrode 165a. The upper and lower gate electrodes 165b and 165a may be in contact with each other in a region that does not vertically overlap the insulating pattern 135 and the intermediate insulating layer 130.

The insulating pattern 135 may be disposed on one side of the intermediate insulating layer 130 to be spaced apart from the intermediate insulating layer 130. The insulating pattern 135 may be spaced apart from the intermediate insulating layer 130 by the gate dielectric layer 162.

In an example embodiment, the lower surface of the insulating pattern 135 may be disposed on substantially the same level as, e.g., coplanar with, a lower surface of the intermediate insulating layer 130, or may be disposed at a higher position than the lower surface of the intermediate insulating layer 130, e.g., relative to the upper surface of the substrate 101.

The insulating pattern 135 may include an insulating material, e.g., at least one of silicon oxide and silicon nitride. For example, the insulating pattern 135 may include a material different from that of the intermediate insulating layer 130.

In an example embodiment, a first thickness t1 of the intermediate insulating layer 130 may be thicker than a second thickness t2 of the insulating pattern 135. The first thickness t1 may be, e.g., in a range of about 30 nm to about 80 nm.

The intermediate insulating layer 130 may include a first side 130S1 in the second horizontal direction, e.g., the Y-direction, and a second side 130S2 opposite to the first side S1. For example, as illustrated in FIG. 2A, the insulating pattern 135 may be on only one of the first and second sides 130S1 and 130S2.

In an example embodiment, the insulating pattern 135 may or may not be disposed in different positions within the plurality of transistor structures TRS1, TRS2, and TRS3.

For example, in the first transistor structure TRS1, the insulating pattern 135 may be disposed on the first side 130S1 of the intermediate insulating layer 130. In this case, the upper and lower gate electrodes 165b and 165a may be in direct contact in a region adjacent to the second side 130S2 of the intermediate insulating layer 130.

For example, in the second transistor structure TRS2, the insulating pattern 135 may be disposed on the second side 130S2 of the intermediate insulating layer 130. In this case, the upper and lower gate electrodes 165b and 165a may be in direct contact in a region adjacent to the first side 130S1 of the intermediate insulating layer 130.

For example, in the third transistor structure TRS3, the insulating pattern 135 may not be disposed. In this case, the upper and lower gate electrodes 165b and 165a may be in direct contact in regions adjacent to both the first side S1 and the second side S2 of the intermediate insulating layer 130. Also, the gate electrode 165 may entirely surround the intermediate insulating layer 130.

In FIGS. 1 to 2C, although a plurality of transistor structures TRS are illustrated as being arranged in an order of the first transistor structure TRS1, the second transistor structure TRS2, the first transistor structure TRS1, and the third transistor structure TRS3 in the Y-direction, an order in which the first to third transistor structures TRS1, TRS2, and TRS3 are arranged may be variously changed according to embodiments. Also, according to embodiments, the plurality of transistor structures TRS may include at least one of the first or second transistor TRS1 or TRS2, and may not include the third transistor structure TRS3.

The contact plugs 171, 172, and 173 may include a first contact plug 171 electrically connected to the lower source/drain regions 150a, a second contact plug 172 electrically connected to the upper source/drain regions 150b, and a third contact plug 173 electrically connected to the gate structure 160. The first and second contact plugs 171 and 172 may be electrically connected to the lower interconnections 196, and the third contact plug 173 may be electrically connected to the upper interconnections 191.

The first contact plug 171 may include a vertical extension portion 171V extending in the Z-direction and a horizontal extension portion 171H extending in a horizontal direction, perpendicular to the Z-direction. For example, as illustrated in FIG. 2B, the vertical and horizontal extension portions 171V and 171H may be arranged into a T-shape, with the vertical extension portion 171V extending between the lower source/drain regions 150a and the horizontal extension portion 171H contacting tops of the lower source/drain regions 150a.

In detail, the vertical extension portion 171V may be electrically connected to the lower interconnections 196, and may extend through the substrate 101 between adjacent active regions 105. The vertical extension portion 171V may have a constant width, as illustrated in FIG. 2B, but may have an inclined side surface of which width decreases in a direction from a lower surface of the substrate 101 toward an upper surface of the substrate 101. In addition, according to embodiments, the vertical extension portion 171V may have an inclined side surface of which a width decreases in a direction from the lower surface of the substrate 101 toward the upper surface of the substrate 101.

In an example embodiment, the horizontal extension portion 171H may extend from an upper portion of the vertical extension portion 171V toward the lower source/drain regions 150a. The vertical extension portion 171V may be in contact with upper ends of the lower source/drain regions 150a.

At least a portion of the insulating pattern 135 may be disposed on the same level as at least a portion of the horizontal extension portion 171H (FIG. 2C). For example, the insulating pattern 135 may have a portion overlapping the horizontal extension portion 171H in the first horizontal direction (e.g., the X-direction), e.g., lateral sides of the insulating pattern 135 and the horizontal extension portion 171H may face and overlap each other. The insulating pattern 135 may prevent or minimize occurrence of parasitic capacitance between the horizontal extension portion 171H and the gate structure 160, to improve electrical characteristics and reliability of the semiconductor device 100. The insulating pattern 135 may suppress parasitic capacitance, together with the intermediate insulating layer 130. As the insulating pattern 135 is disposed on only one side of the intermediate insulating layer 130, a semiconductor device having a common gate electrode structure in which the upper and lower gate electrodes 165b and 165a are connected while minimizing parasitic capacitance may be provided.

A third thickness t3 of the horizontal extension portion 171H may be thinner than the first thickness of the intermediate insulating layer 130. For example, the third thickness t3 may be substantially the same as the second thickness t2 of the insulating pattern 135. An upper surface of the horizontal extension portion 171H may be located at a level lower than a level of an upper surface of the intermediate insulating layer 130, e.g., relative to the upper surface of the substrate 101.

In FIGS. 1 to 2C, the first contact plug 171 is illustrated as being a common contact plug for simultaneously connecting the lower source/drain regions 150a on adjacent active regions 105, but may be a single contact plug connected to a lower source/drain region 150a.

The second contact plug 172 may include a vertical extension portion 172V extending in the Z-direction and a horizontal extension portion 172H extending in a horizontal direction, perpendicular to the Z-direction. The horizontal extension portion 172H may be in contact with upper ends of the upper source/drain regions 150b. For example, as illustrated in FIG. 2B, the vertical and horizontal extension portions 172V and 172H may be arranged into an inverted L-shape.

The third contact plug 173 may be connected to the upper gate electrode 165b. The lower gate electrode 165a and the upper gate electrode 165b may be electrically connected to each other, and the same electrical signal may be applied through the third contact plug 173.

The first to third contact plugs 171, 172, and 173 may include, e.g., at least one of titanium nitride (TiN), tantalum nitride (TaN), tungsten nitride (WN), tungsten carbon nitride (WCN), titanium (Ti), tantalum (Ta), tungsten (W), copper (Cu), aluminum (Al), cobalt (Co), ruthenium (Ru), or molybdenum (Mo).

The gate isolation patterns GC may physically separate the plurality of transistor structures TRS in the second horizontal direction, e.g., the Y-direction. The gate isolation patterns GC may be disposed between adjacent transistor structures TRS. The gate isolation patterns GC may be disposed to be spaced apart from each other in the Y-direction. The gate isolation patterns GC may extend, e.g., lengthwise, in the Z-direction to contact the device isolation layer 107. The gate isolation patterns GC may include an insulating material, e.g., a nitride-based material.

The upper interconnections 191 may be disposed on the gate structure 160, and the lower interconnections 196 may be disposed below the substrate 101. Each of the upper and lower interconnections 191 and 196 is illustrated as a single layer, but may have a multilayer structure having a plurality of levels, according to embodiments. The first and second contact plugs 171 and 172 are illustrated as being connected to the lower interconnections 191, and the third contact plug 173 is illustrated as being connected to the upper interconnections 191, but connection relationship between the contact plugs 171, 172, and 173 and the upper and lower interconnections 191 and 196 may be variously changed according to embodiments.

The interlayer insulating layers 181, 182, 183, 184, 185, and 186 may include an insulating material, e.g., silicon oxide. The interlayer insulating layers 181, 182, 183, 184, 185, and 186 may include a first interlayer insulating layer 181 covering the lower transistor TRa on the substrate 101, a second interlayer insulating layer 182 covering the upper transistor TRb on the first interlayer insulating layer 181, first and second upper interlayer insulating layers 183 and 184 on the second interlayer insulating layer 182, and first and second lower interlayer insulating layers 185 and 186 below the substrate 101. According to embodiments, a boundary between the first and second interlayer insulating layers 181 and 182 may not be distinguished.

Figure 3A:
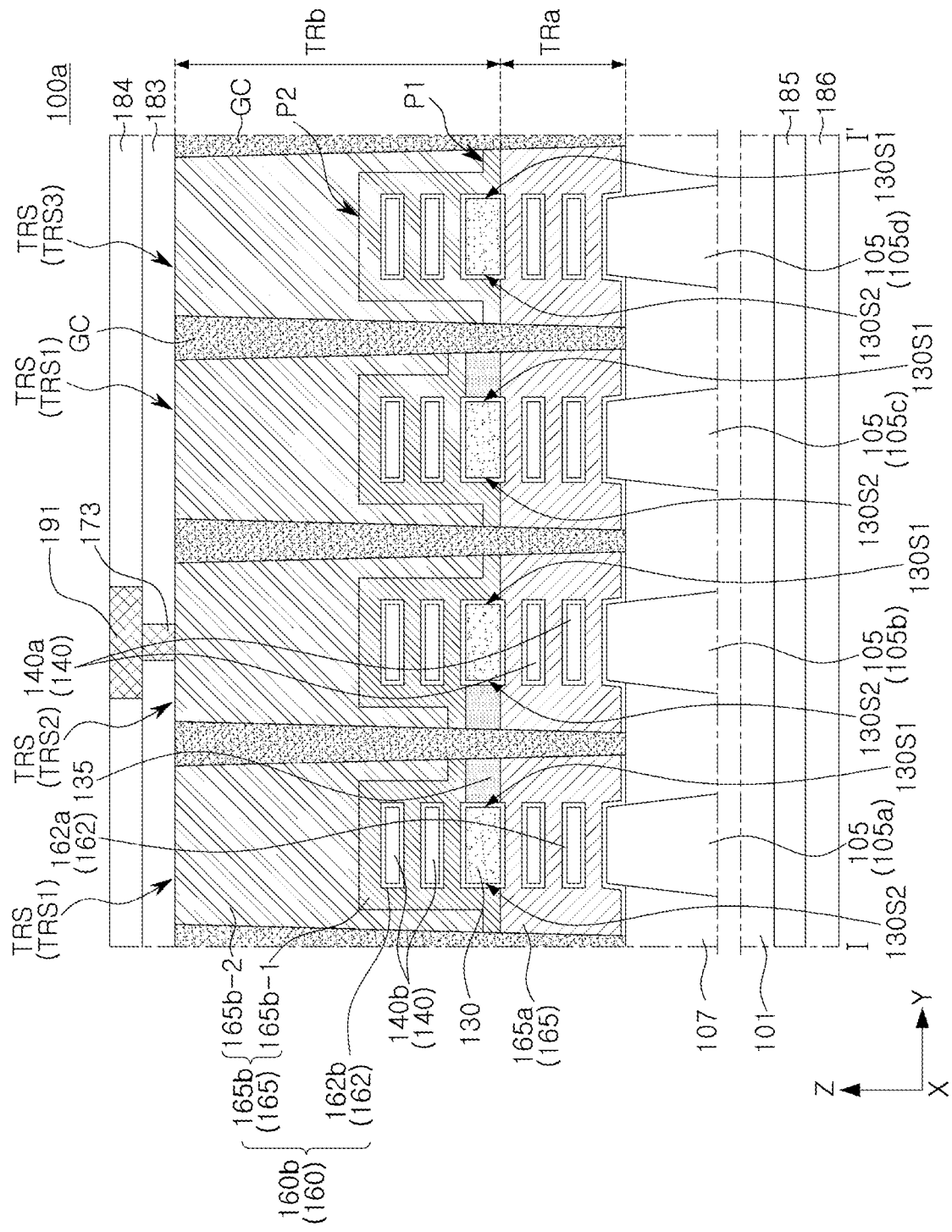
FIGS. 3A and 3B are cross-sectional views illustrating a semiconductor device according to example embodiments.
Figure 3B:
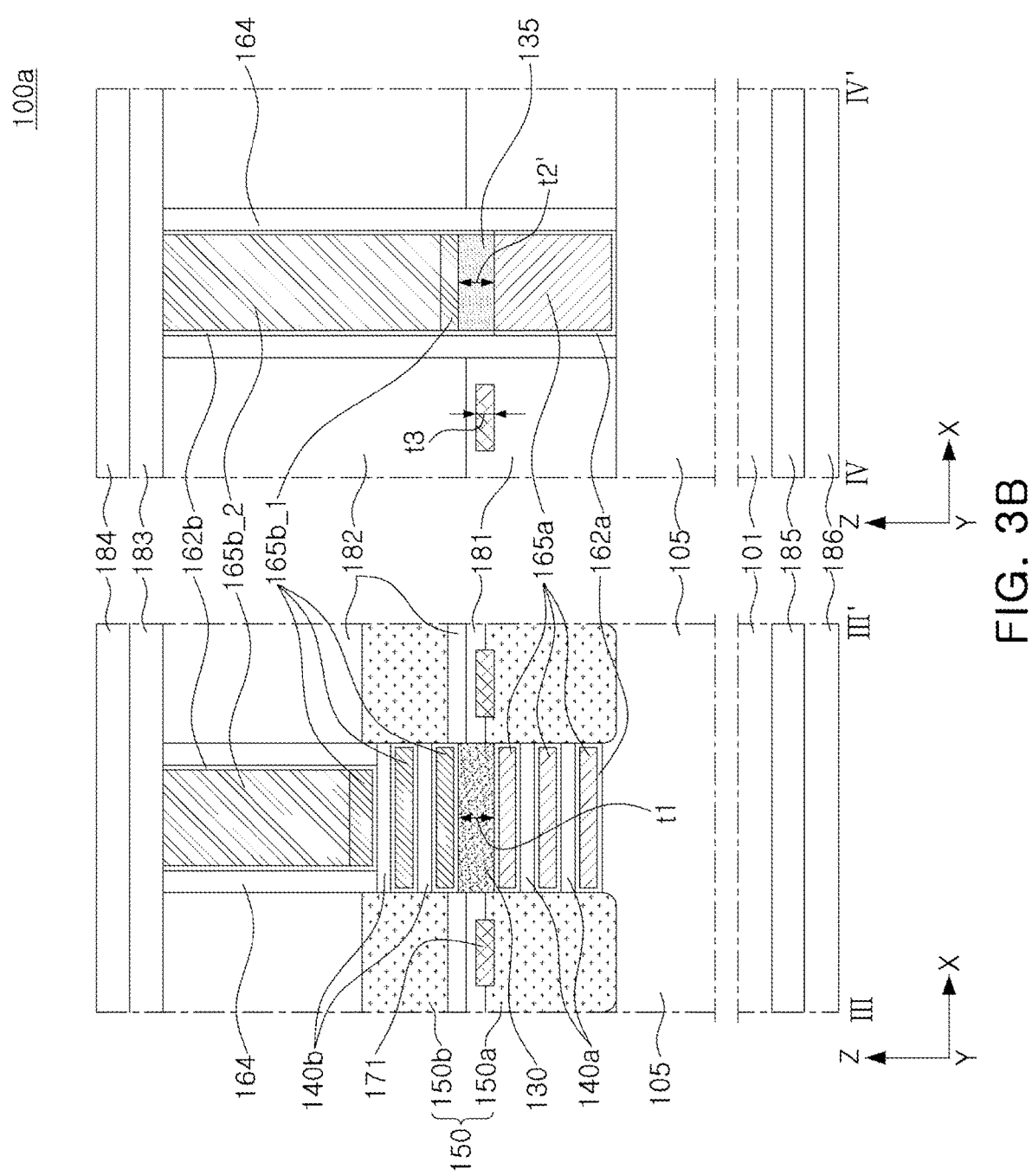

FIGS. 3A and 3B are cross-sectional views illustrating a semiconductor device according to example embodiments. FIG. 3A illustrates a region corresponding to a cross-section of the semiconductor device of FIG. 1, taken along line I-I', and FIG. 3B illustrates regions corresponding to cross-sections of the semiconductor device of FIG. 1, taken along lines III-III' and IV-IV'.

Referring to FIGS. 3A and 3B, in a semiconductor device 100a, a second thickness t2' of the insulating pattern 135 may be relatively thicker than that of the semiconductor device of FIGS. 2A to 2C. In an example embodiment, the second thickness t2' of the insulating pattern 135 may be substantially the same as the first thickness t1 of the intermediate insulating layer 130. The insulating pattern 135 may be adjusted to have various thicknesses as the same is formed by a process, separate from the intermediate insulating layer 130. For example, the insulating pattern 135 may have an optimized thickness capable of preventing parasitic capacitance with the first contact plug 171 without deteriorating electrical characteristics between upper channel layers 140b and an upper gate electrode 165b.

Figure 4A:
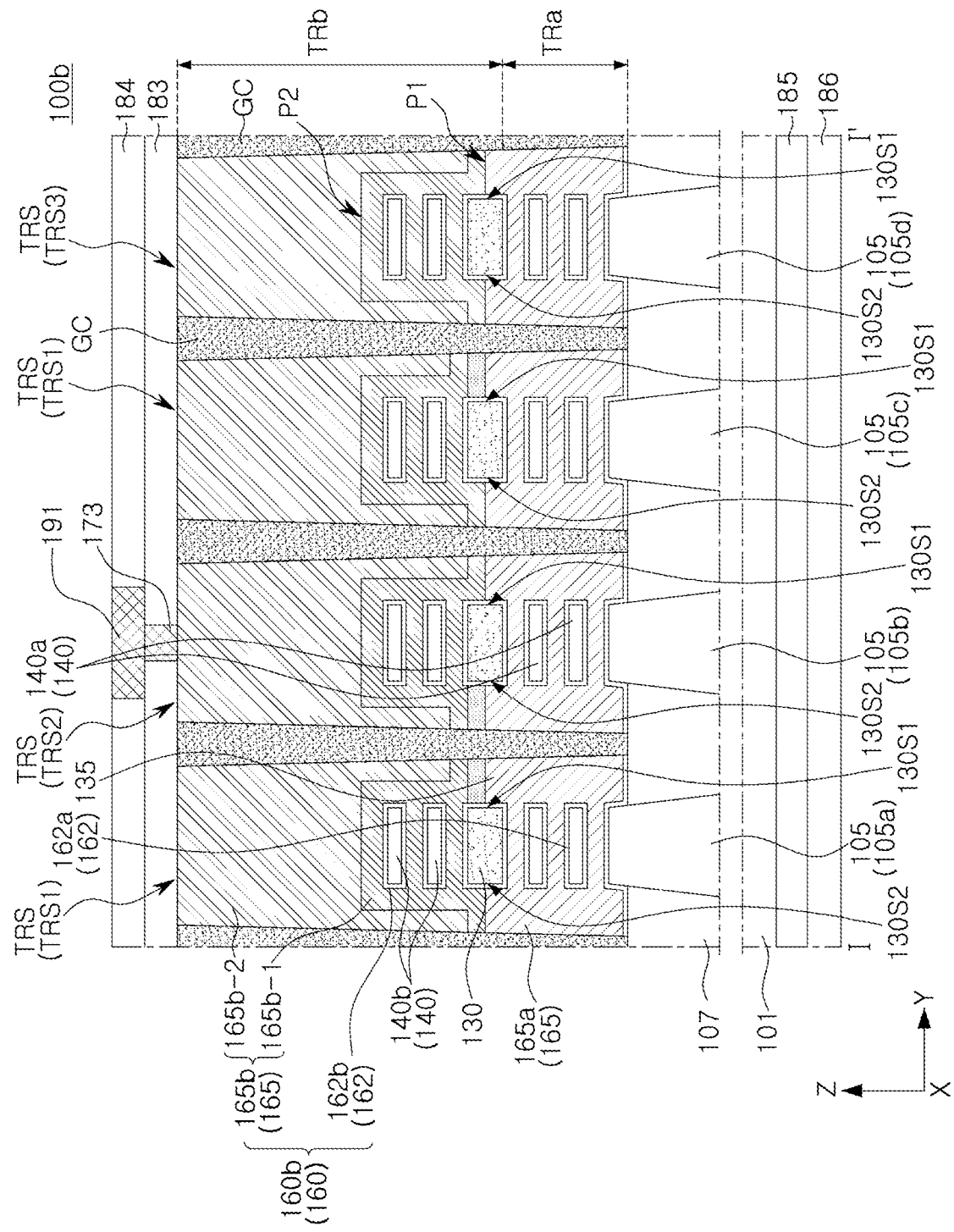
FIGS. 4A and 4B are cross-sectional views illustrating a semiconductor device according to example embodiments.
Figure 4B:
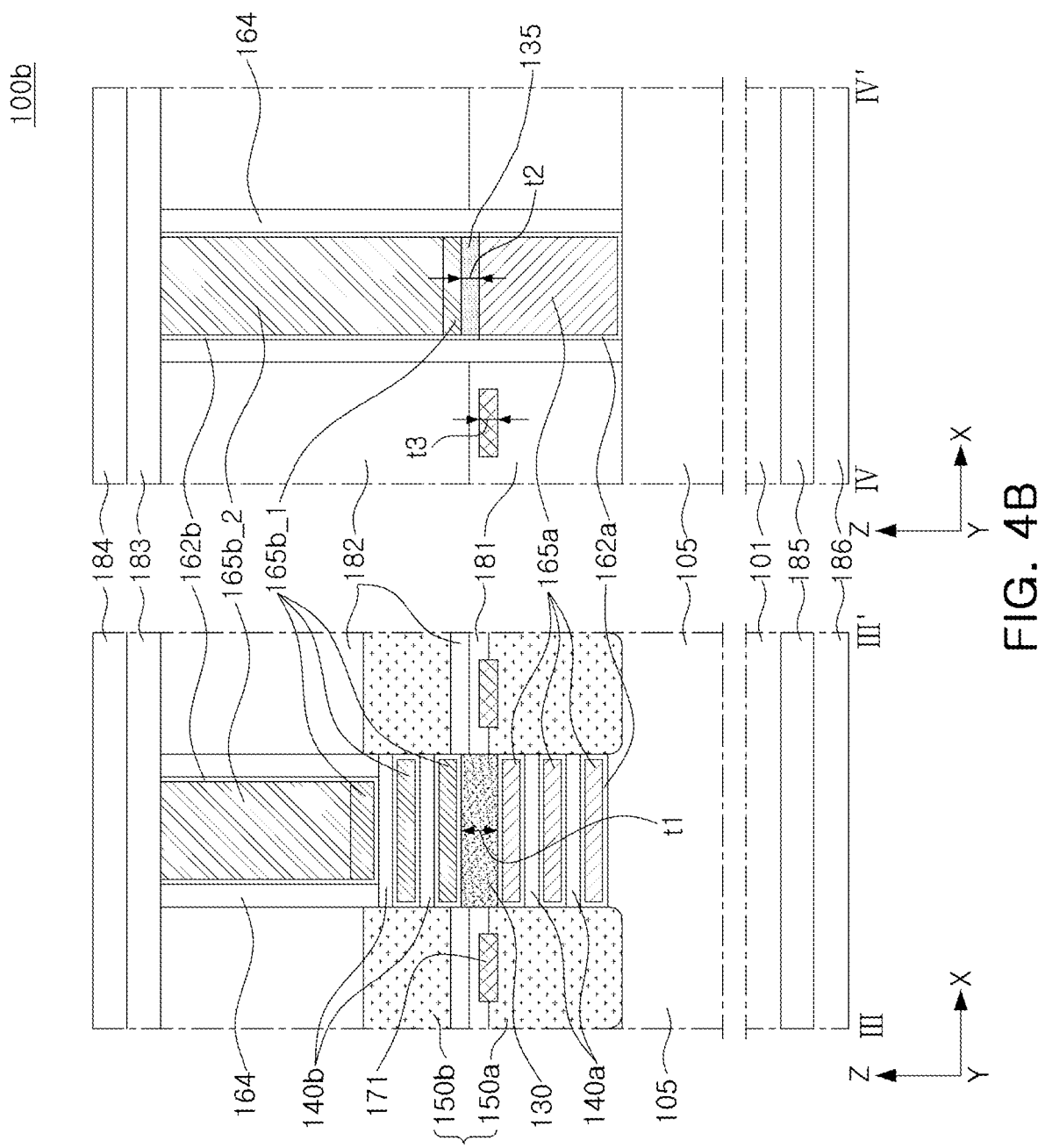

FIGS. 4A and 4B are cross-sectional views illustrating a semiconductor device according to example embodiments. FIG. 4A illustrates a region corresponding to a cross-section of the semiconductor device of FIG. 1, taken along line I-I', and FIG. 4B illustrates regions corresponding to cross-sections of the semiconductor device of FIG. 1, taken along lines III-III' and IV-IV'.

Referring to FIGS. 4A and 4B, in a semiconductor device 100b, an uppermost surface of a lower gate electrode 165a may be located at a level higher than a level of a lower surface of an intermediate insulating layer 130. The lower gate electrode 165a may cover the lower surface and a portion of a side surface of the intermediate insulating layer 130. A height of an upper surface of the lower gate electrode 165a may be variously changed according to process conditions.

The insulating pattern 135 may be disposed on the uppermost surface of the lower gate electrode 165a. Therefore, a lower surface of the insulating pattern 135 may be located at a level higher than a level of the lower surface of the intermediate insulating layer 130. In an example embodiment, an upper surface of the insulating pattern 135 may be substantially the same as an upper surface of the intermediate insulating layer 130 or located at a level lower than a level of the upper surface of the intermediate insulating layer 130.

Figure 5:
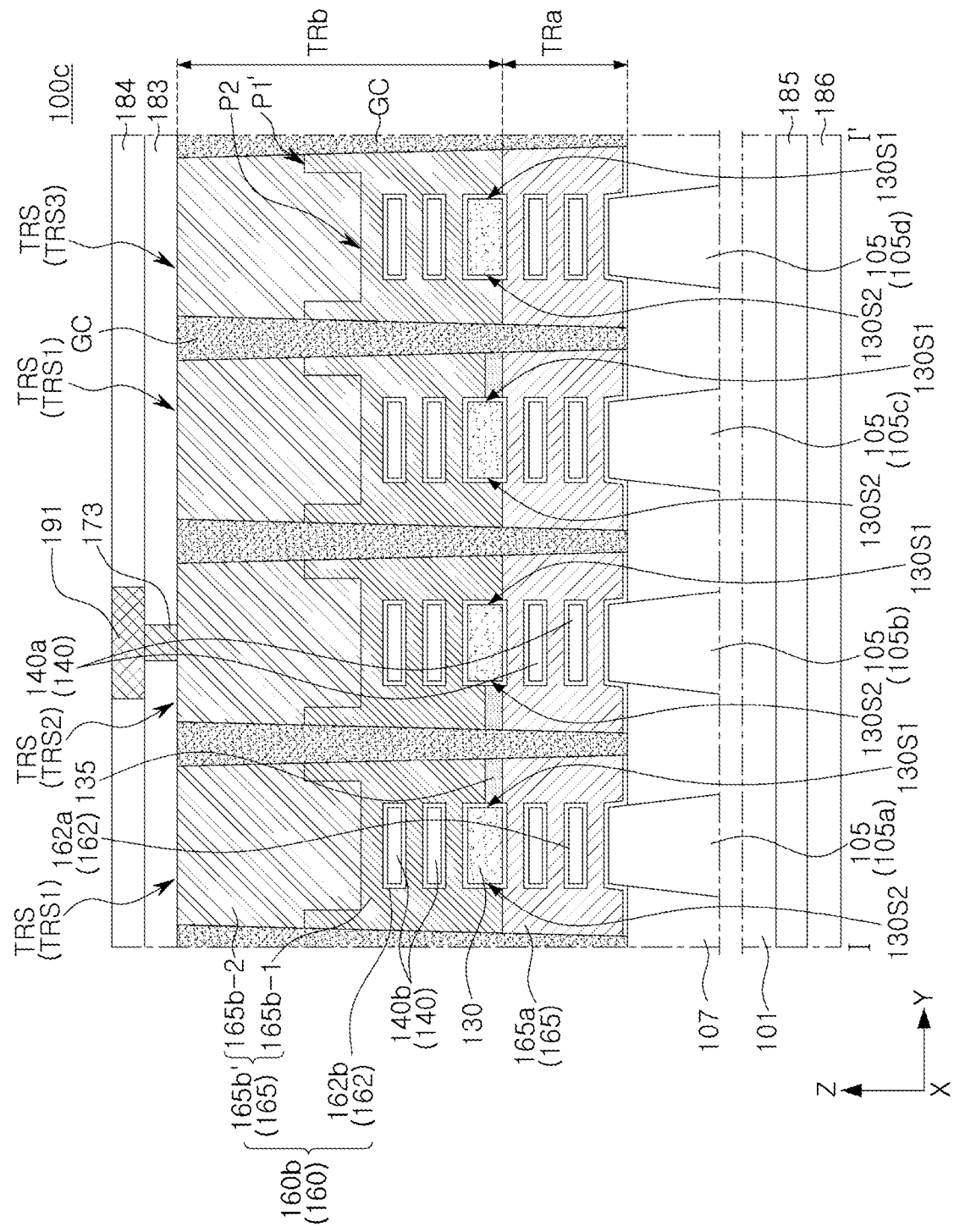
FIG. 5 is a cross-sectional view illustrating a semiconductor device according to example embodiments.

FIG. 5 is a cross-sectional view illustrating a semiconductor device according to example embodiments. FIG. 5 illustrates a region corresponding to a cross-section of the semiconductor device of FIG. 1, taken along line I-I'.

Referring to FIG. 5, in a semiconductor device 100c, an upper gate electrode 165b' may have a structure different from that of the upper gate electrode 165b of FIGS. 2A to 2C.

The upper gate electrode 165b' may include a first upper gate electrode 165b_1' and a second upper gate electrode 165b_2' on the first upper gate electrode 165b_1'. The first upper gate electrode 165b_1' may include a first portion P1' covering an upper surface of an insulating pattern 135 and an upper surface of a lower gate electrode 165a, and the second portion P2 covering upper channel layers 140b. Unlike FIGS. 2A to 2C, an uppermost surface of the first portion P1' may be located at a higher level than an upper surface of the second portion P2. The first portion P1' may include a section extending along side surfaces of the gate isolation patterns GC between the second portion P2 and the gate isolation patterns GC.

Figure 6:
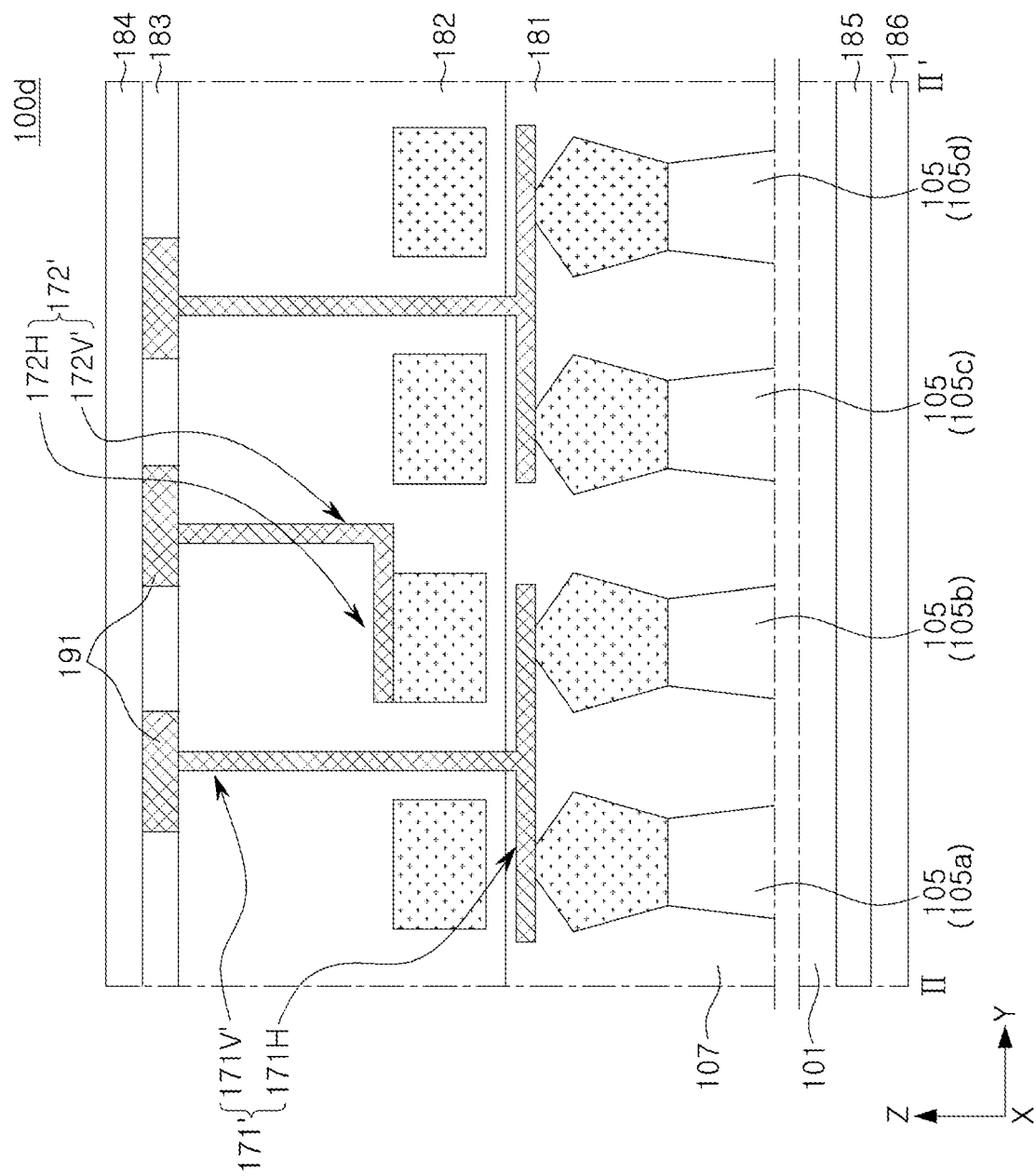
FIG. 6 is a cross-sectional view illustrating a semiconductor device according to example embodiments.

FIG. 6 is a cross-sectional view illustrating a semiconductor device according to example embodiments. FIG. 6 illustrates a region corresponding to a cross-section of the semiconductor device of FIG. 1, taken along line II-II'.

Referring to FIG. 6, a semiconductor device 100d may include contact plugs 171' and 172', different from those of the semiconductor device 100 of FIGS. 2A to 2C.

A first contact plug 171' may include a vertical extension portion 171V' and the horizontal extension portion 171H, and the vertical extension portion 171V' may be connected to the upper interconnections 191. For example, the vertical extension portion 171V' may pass through first and second interlayer insulating layers 181 and 182 to contact the horizontal extension portion 171H, and the horizontal extension portion 171H may extend toward the lower source/drain regions 150a from a lower portion of the vertical extension portion 171V'.

A second contact plug 172' may be connected to the upper interconnections 191, similarly to the first contact plug 171'.

FIGS. 7A to 7F are views illustrating stages in a method of manufacturing a semiconductor device according to example embodiments. FIGS. 7A to 7F are views illustrating a region corresponding to FIG. 2A.

Figure 7A:
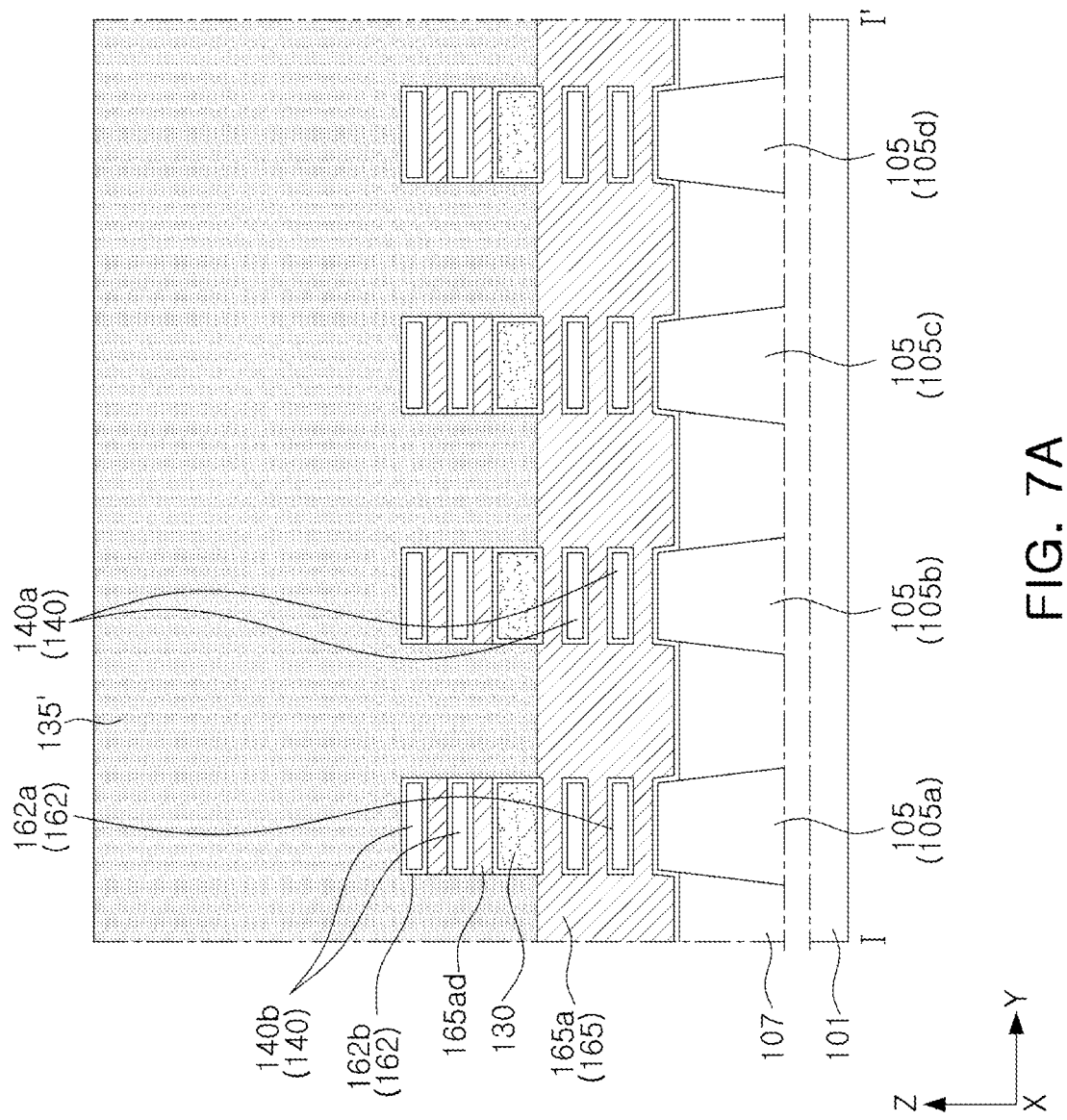
FIGS. 7A to 7F are views illustrating a process sequence of a method of manufacturing a semiconductor device according to example embodiments.

Referring to FIG. 7A, on the substrate 101, the active regions 105, the device isolation layer 107, and the plurality of channel layers 140a and 140b may be formed, the source/drain regions 150 may be formed, the lower gate electrode 165a may be formed, and an insulating material layer 135' may be formed.

The plurality of channel layers 140a and 140b and sacrificial layers may be alternately stacked on the substrate 101, and a portion of the plurality of channel layers 140a and 140b, a portion of the sacrificial layers, and a portion of the substrate 101 may be removed to define the active regions 105. In this operation, an intermediate insulating layer 130 may be formed between the lower channel layers 140a and the upper channel layers 140b, and a portion of the intermediate insulating layer 130 may be removed together with a portion of the plurality of channel layers 140a and 140b and the sacrificial layers. The sacrificial layers may be removed by a subsequent process to provide a space filled with the gate dielectric layers 162a and 162b and the gate electrodes 165a and 165b.

The plurality of channel layers 140a and 140b and the sacrificial layers may include different semiconductor materials. For example, the plurality of channel layers 140a and 140b may include silicon (Si), and the sacrificial layers may include silicon germanium (SiGe). The active regions 105 may be defined as a protruding fin portion of the substrate 101 by removing the portion of the substrate 101, and may be formed to have a linear shape extending in one direction, e.g., the X-direction. The device isolation layer 107 may be formed, in a region from which the portion of the substrate 101 is removed, by filling an insulating material and then recessing the active regions 105 to protrude. The active regions 105, the plurality of channel layers 140a and 140b, and the sacrificial layers, extending in the X-direction, may form a semiconductor structure.

A sacrificial gate structure intersecting the semiconductor structure and extending in one direction, e.g., the Y-direction, may be formed on the substrate 101, and the gate spacers 164 (refer to FIG. 1) may be formed on both sides of the sacrificial gate structure.

An exposed portion of the semiconductor structure may be etched using the sacrificial gate structure and the gate spacers 164 as a mask, to form a recess region of which an upper surface is exposed to the active regions 105. According to embodiments, in this operation, a portion of the sacrificial layers may be additionally removed from side surfaces, to form inner spacers. Lower source/drain regions 150a (refer to FIGS. 1 and 2C) may be formed on upper surfaces of the active regions 105 having the recess region. The lower source/drain regions 150a may include epitaxial layers grown from the active regions 105 and the lower channel layers 140a by performing an epitaxial growth process. The lower source/drain regions 150a may include impurities by in-situ doping, and may include a plurality of layers having different doping elements and/or doping concentrations.

The first interlayer insulating layer 181 (refer to FIG. 2C) covering the lower source/drain regions 150a may be formed, and the horizontal extension portions 171H and 172H of the contact plugs 171, 172, and 173 (refer to FIG. 2C) may be formed. Thereafter, a portion of the second interlayer insulating layer 182 (refer to FIG. 2C) may be formed. An epitaxial growth process may be performed to form the upper source/drain regions 150b, which may be epitaxial layers grown from the upper channel layers 140b. The upper source/drain regions 150b may vertically overlap the lower source/drain regions 150a. The upper source/drain regions 150b may include impurities by in-situ doping, and may include a plurality of layers having different doping elements and/or doping concentrations. A conductivity type of an impurity doped in the upper source/drain regions 150b may be different from a conductivity type of an impurity doped in the lower source/drain regions 150a.

Openings may be formed by removing the sacrificial gate structure to expose side surfaces of the sacrificial layers, and performing a strip process for selectively removing the sacrificial layers with respect to the plurality of channel layers 140a and 140b. The gate dielectric layers 162a and 162b may be formed by depositing a dielectric material in the openings. In this operation, a strip process for the lower sacrificial layers alternately stacked with the lower channel layers 140a and a strip process for the upper sacrificial layers alternately stacked with the upper channel layers 140b may be separately performed, or a dielectric material deposition process for the openings of the upper and lower sacrificial layers may be separately performed, to form the upper and lower gate dielectric layers 162b and 162a having different materials or different thicknesses.

The lower gate electrode 165a may be formed by filling a conductive material in the openings and in a region from which the sacrificial gate structures are removed, and removing a portion of the conductive material. The conductive material may include, e.g., at least one of W, Ti, Ta, Mo, TiN, TaN, WN, TiON, TiAlC, TiAlN, and TaAlC. Although a level of an upper surface of the lower gate electrode 165a is illustrated as being equal to a level of a lower surface of the intermediate insulating layer 130, the level of the upper surface of the lower gate electrode 165a may be variously adjusted according to process conditions. In this operation, the conductive material may remain between the upper channel layers 140b, to form dummy conductive material layers 165ad.

The insulating material layer 135' covering the lower gate electrode 165a and the upper channel layers 140b may be formed on the lower gate electrode 165a. The insulating material layer 135' may include, e.g., silicon oxide or silicon nitride.

Figure 7B:
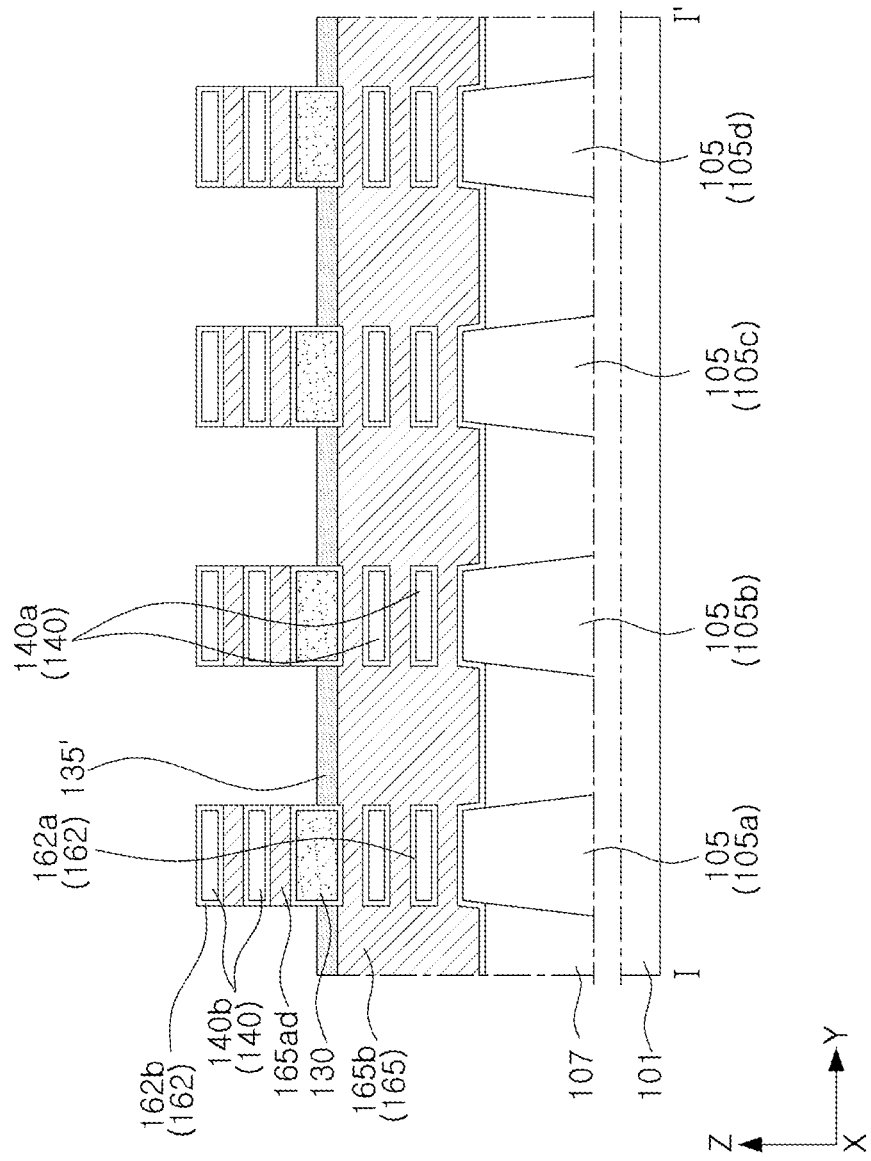

Referring to FIG. 7B, the insulating material layer 135' may be partially removed to expose the dummy conductive material layer 165ad.

The insulating material layer 135' may be selectively etched with respect to the upper channel layers 140b and the upper gate dielectric layer 162b, such that a level of an upper surface of the insulating material layer 135' is formed to be the same as a level of an upper surface of the intermediate insulating layer 130 or be lower than the level of the upper surface of the intermediate insulating layer 130. Therefore, a thickness of the insulating material layer 135' may be adjusted to be thinner than a thickness of the intermediate insulating layer 130.

Remaining portion of the insulating material layer 135' may be disposed at a level parallel to the horizontal extension portion 171H. At least a portion of the insulating material layer 135' may overlap the horizontal extension portion 171H in the X-direction. Therefore, it is possible to minimize occurrence of parasitic capacitance of the conductive material between the horizontal extension portion 171H and the upper and lower gate electrodes 165b and 165a.

Figure 7C:
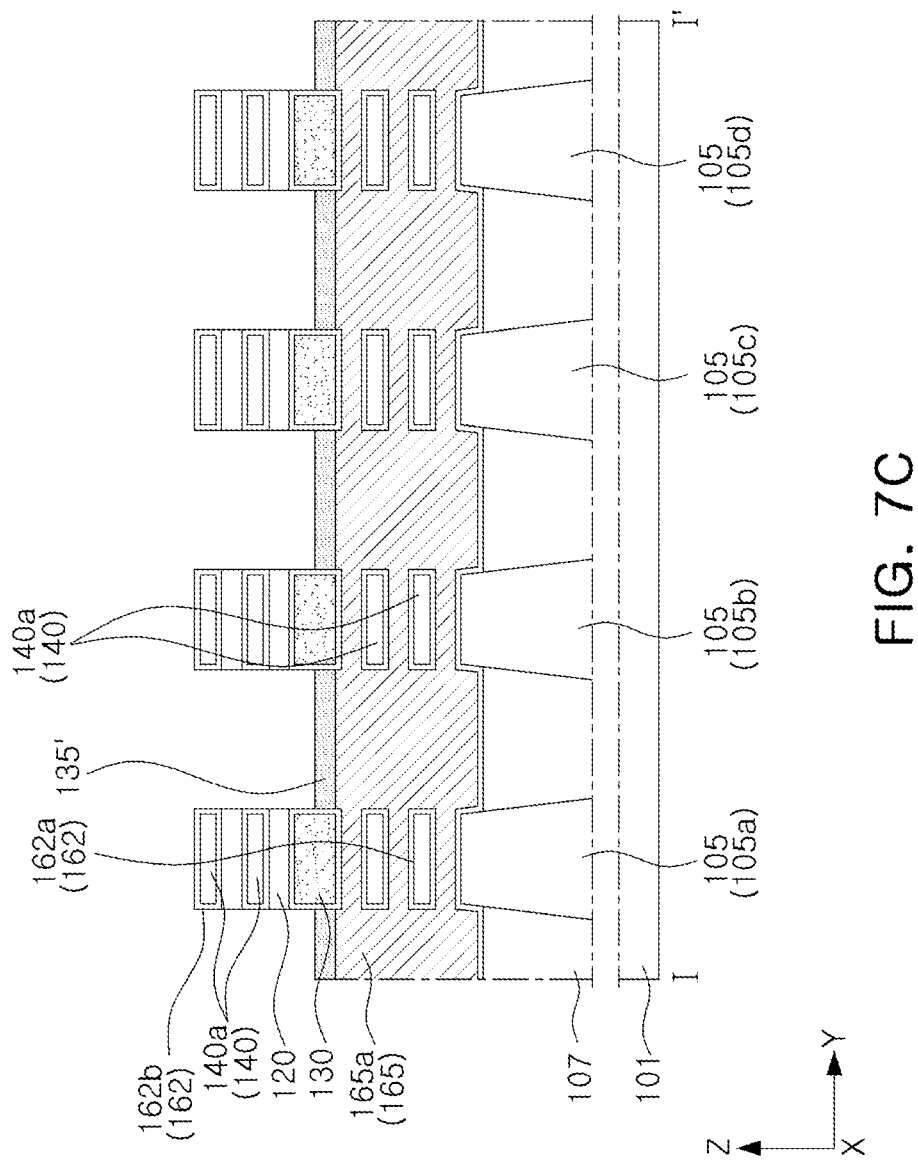

Referring to FIG. 7C, the dummy conductive material layers 165ad may be removed to form sacrificial metal layers 120.

The dummy conductive material layers 165ad may be selectively removed with respect to the upper channel layers 140b and the upper gate dielectric layer 162b, and a conductive material may be filled in a region from which the dummy conductive material layers 165ad are removed to form the sacrificial metal layers 120. The sacrificial metal layers 120 may be formed by filling a region from which the sacrificial gate structure is removed, including the region from which the dummy conductive material layers 165a are removed, with the conductive material, and performing an etch-back process. The conductive material may include, e.g., at least one of W, Ti, Ta, Mo, TiN, TaN, WN, TiON, TiAlC, TiAlN, and TaAlC. The conductive material may include a material different from that of the lower gate electrode 165a or the dummy conductive material layers 165ad. Therefore, the sacrificial metal layers 120 may have an etch selectivity ratio with regard to the lower gate electrode 165a under a specific etch condition.

According to embodiments, an operation of forming the sacrificial metal layers 120 may be omitted.

Figure 7D:
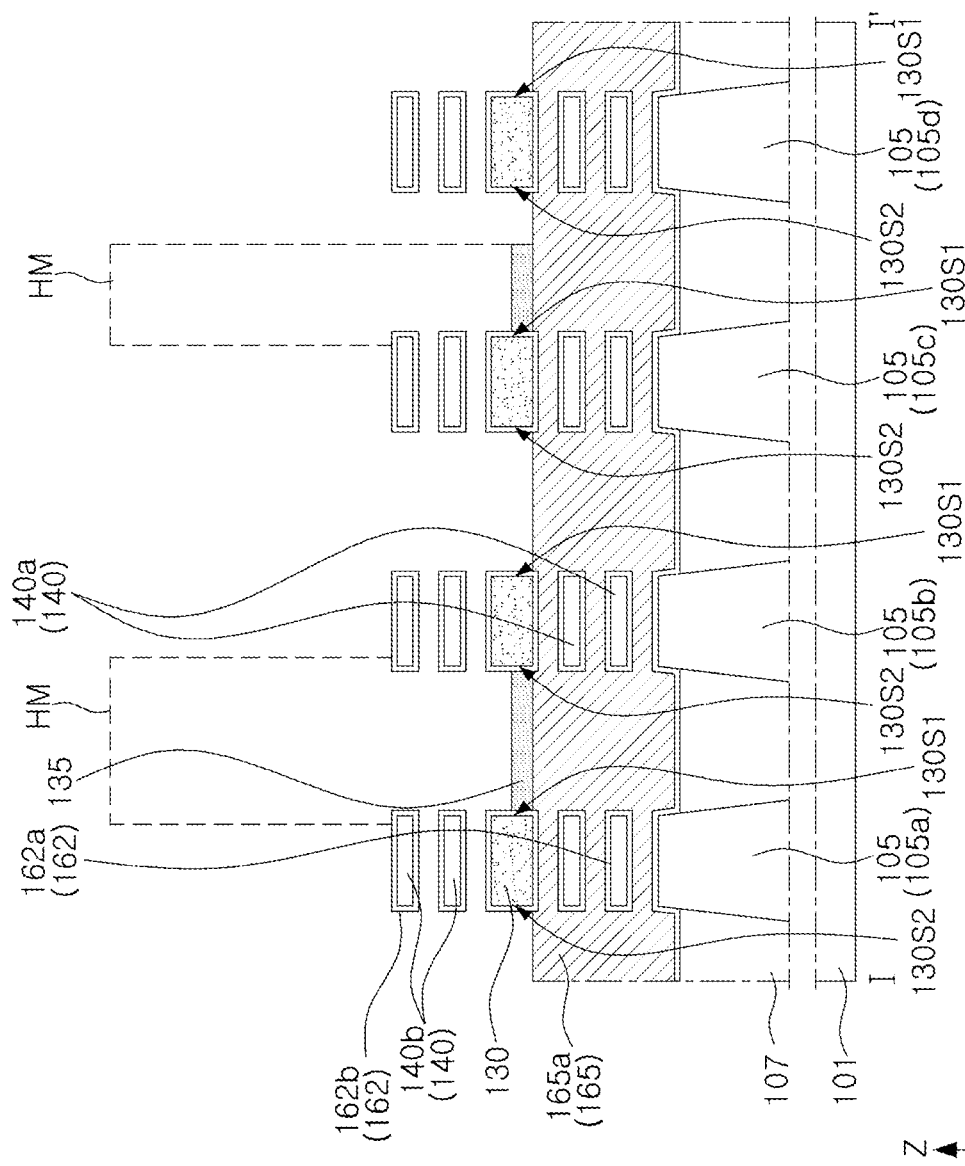

Referring to FIG. 7D, the insulating pattern 135 may be formed using a mask HM. A portion of the insulating material layer 135' may be removed by a patterning process, using the mask HM, to form the insulating pattern 135.

The intermediate insulating layer 130 may include the first side 130S1 in the second horizontal direction, e.g., the Y-direction, and the second side 130S2 opposite to the first side 130S1. The insulating material layer 135' disposed on at least one of the first side 130S1 or the second side 130S2 of the intermediate insulating layer 130 may be removed by adjusting a position of an opening of the mask HM. Therefore, the insulating pattern 135 may be disposed on the first side 130S1 of the intermediate insulating layer 130 or on the second side 130S2 of the intermediate insulating layer 130.

The lower gate electrode 165a may be exposed in a region from which the intermediate insulating layer 130 is removed. Therefore, the upper gate electrode 165b and the lower gate electrode 165a formed by a subsequent process may be connected to each other to form a common gate electrode structure.

A semiconductor device having the common gate electrode structure and controlled to minimize parasitic capacitance between a contact plug and a gate electrode may be provided by the insulating pattern 135 formed by the patterning process. In the patterning process, only the sacrificial metal layers 120 may be removed without removing the lower gate electrode 165a. After the insulating pattern 135 is formed, the mask HM may be removed.

Figure 7E:
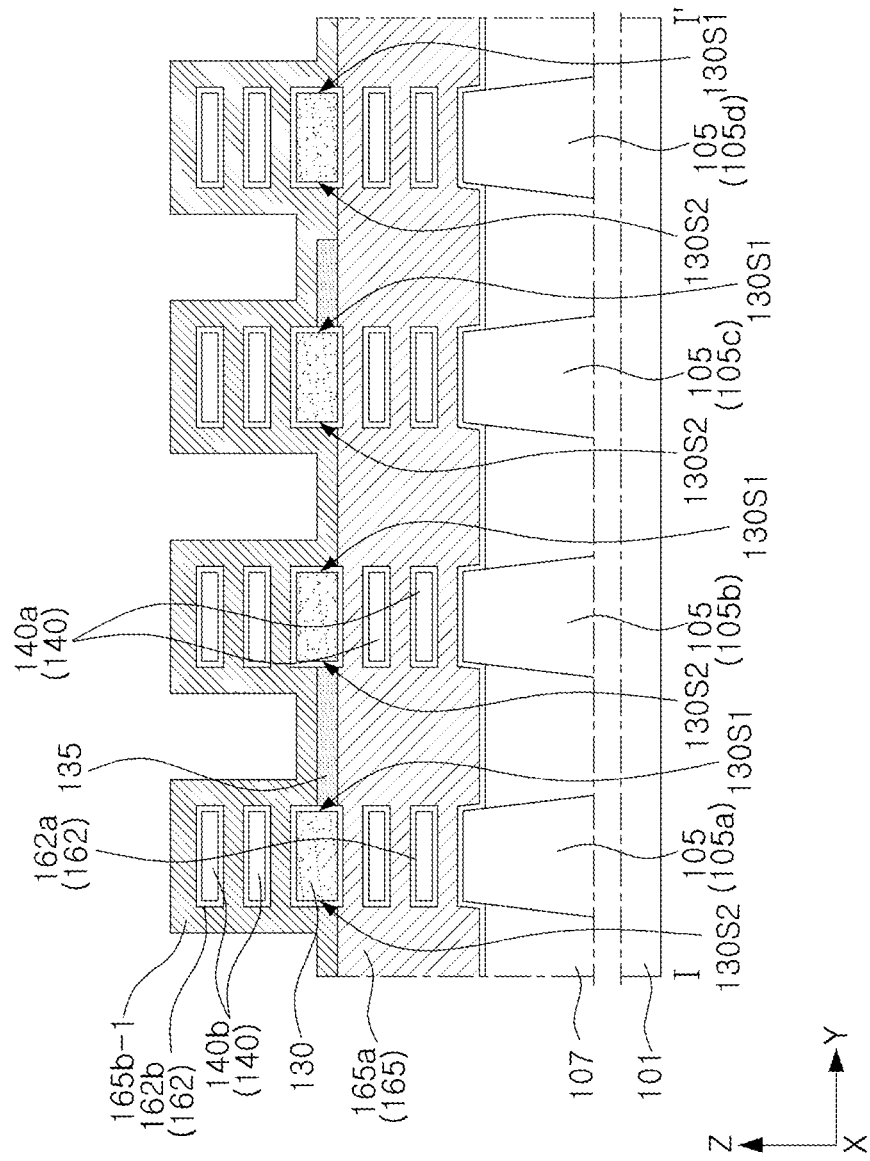

Referring to FIG. 7E, the first upper gate electrode 165b_1 may be formed. A conductive material may be deposited to form the first upper gate electrode 165b_1 surrounding the upper channel layers 140b while conformally covering the lower gate electrode 165a and the insulating pattern 135. The first upper gate electrode 165b_1 may extend between the upper channel layers 140b while filling a space from which the sacrificial metal layers 120 are removed.

Figure 7F:
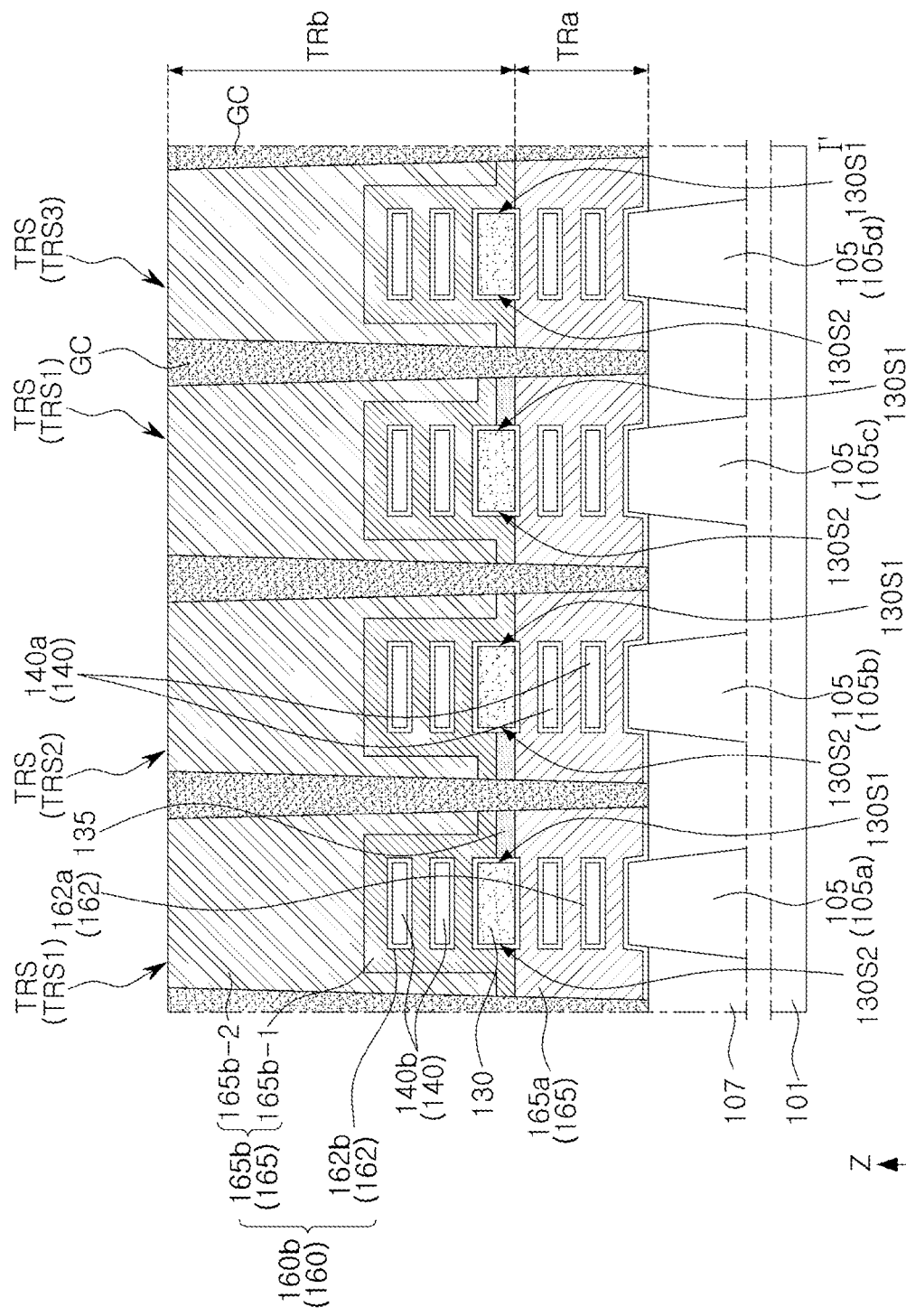

Referring to FIG. 7F, the second upper gate electrode 165b_2 may be formed, and the gate isolation patterns GC may be formed.

The second upper gate electrode 165*b*_2 may be formed by depositing a conductive material on the first upper gate electrode 165*b*_1 and performing a planarization process. For example, the second upper gate electrode 165*b*_2 may include a conductive material, different from that of the first upper gate electrode 165*b*_1. The second upper gate electrode 165*b*_2 may be formed to prepare an upper gate electrode 165*b* including the first and second upper gate electrodes 165*b*_1 and 165*b*_2.

The gate isolation patterns GC may be formed by forming openings exposing the device isolation layer 107 through the upper and lower gate electrodes 165*b* and 165*a* and filling the openings with an insulating material. The gate isolation patterns GC may be disposed to be spaced apart in the Y-direction, and may physically separate adjacent upper and lower gate electrodes 165*b* and 165*a*. Therefore, a plurality of gate structures 160 separated from each other may be formed.

Next, referring to FIGS. 2A to 2C, the upper interlayer insulating layers 183 and 184 may be formed, the third contact plug 173 and the upper interconnections 191 may be formed, and the lower interlayer insulating layers 185 and 186, lower interconnections 196, and vertical extension portions 171V and 172V of the first and second contact plugs 171 and 172 may be formed. According to embodiments, the vertical extension portions 171V and 172V of the first and second contact plugs 171 and 172 may be formed by different process operations.

FIGS. 8A to 8G are views of stages in a method of manufacturing a semiconductor device according to example embodiments.

Figure 8A:
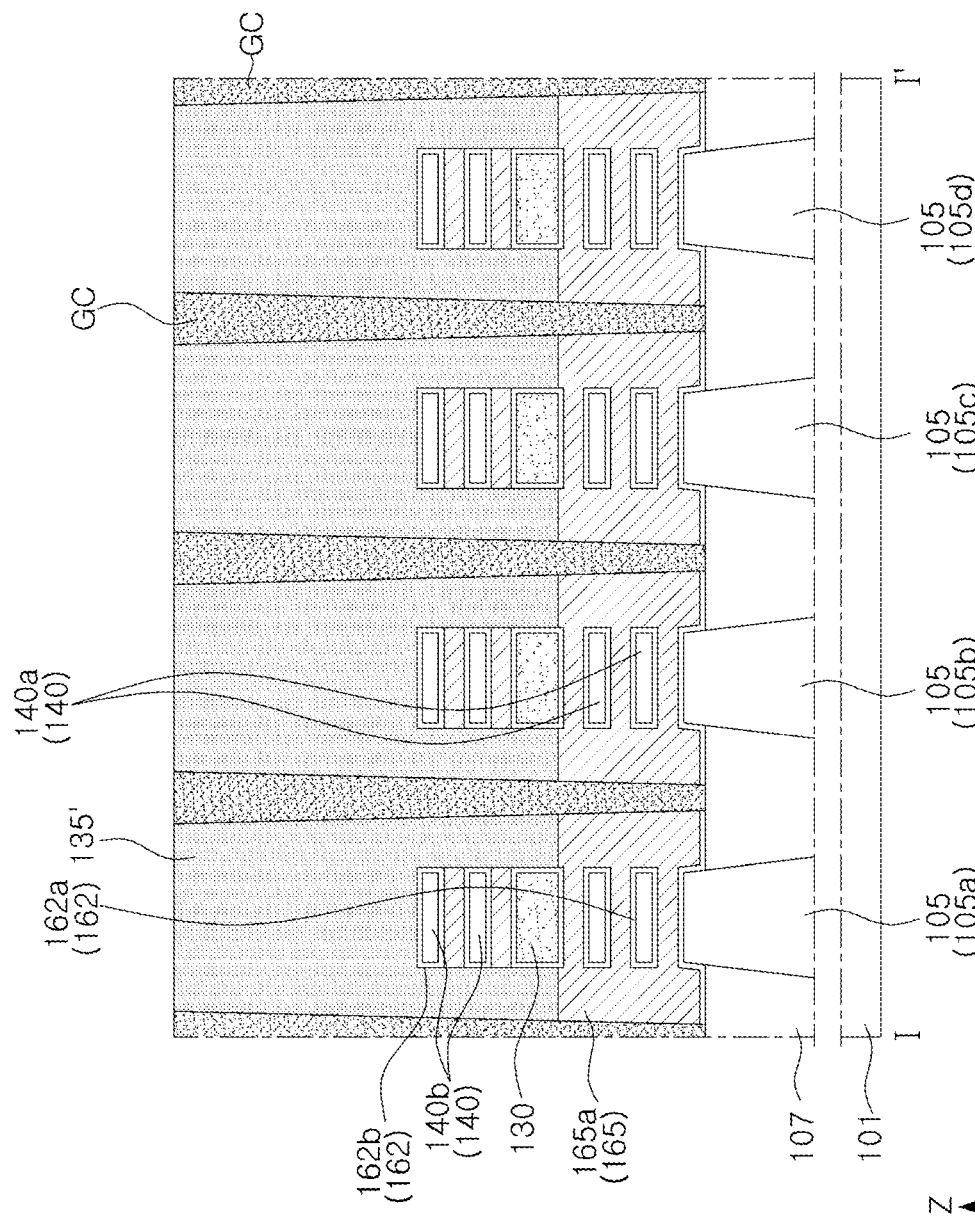
FIGS. 8A to 8G are views illustrating a process sequence of a method of manufacturing a semiconductor device according to example embodiments.

Referring to FIG. 8A, the same or similar process to that described in FIG. 7A may be performed first. Next, the gate isolation patterns GC may be formed. The gate isolation patterns GC may be formed by filling an insulating material in openings passing through the insulating material layer 135' and the lower gate electrode 165*a* such that a device isolation layer 107 between the active regions 105 is exposed.

Figure 8B:
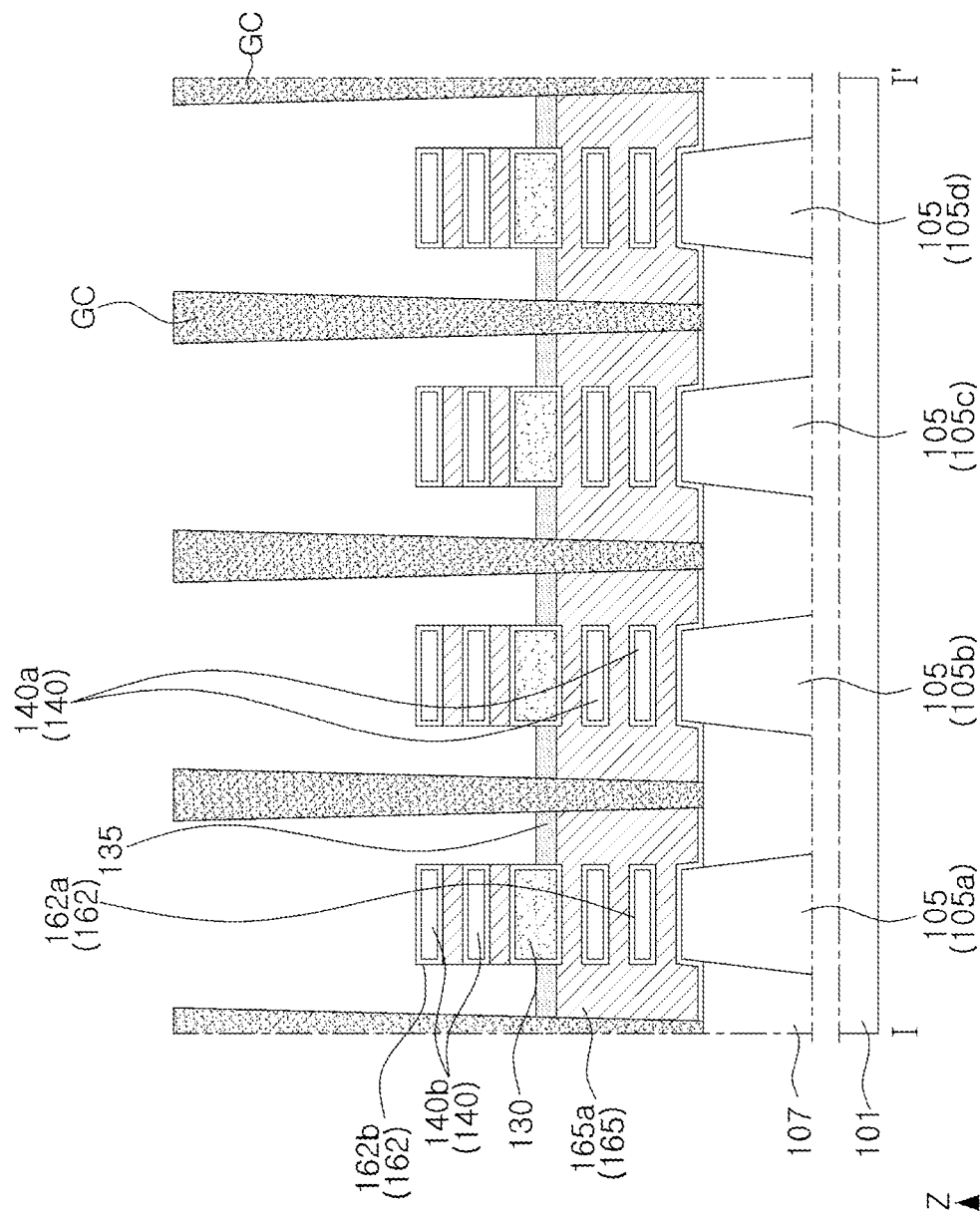

Referring to FIG. 8B, the insulating material layer 135' may be partially removed to expose dummy conductive material layers 165*ad*. A thickness of the insulating material layer 135' may be adjusted by selectively etching the insulating material layer 135' with respect to the channel layers 140*b* and the upper gate dielectric layer 162*b*. In the etching process, the gate isolation patterns GC may not be etched. Therefore, a portion of side surfaces of the gate isolation patterns GC may be exposed.

Figure 8C:
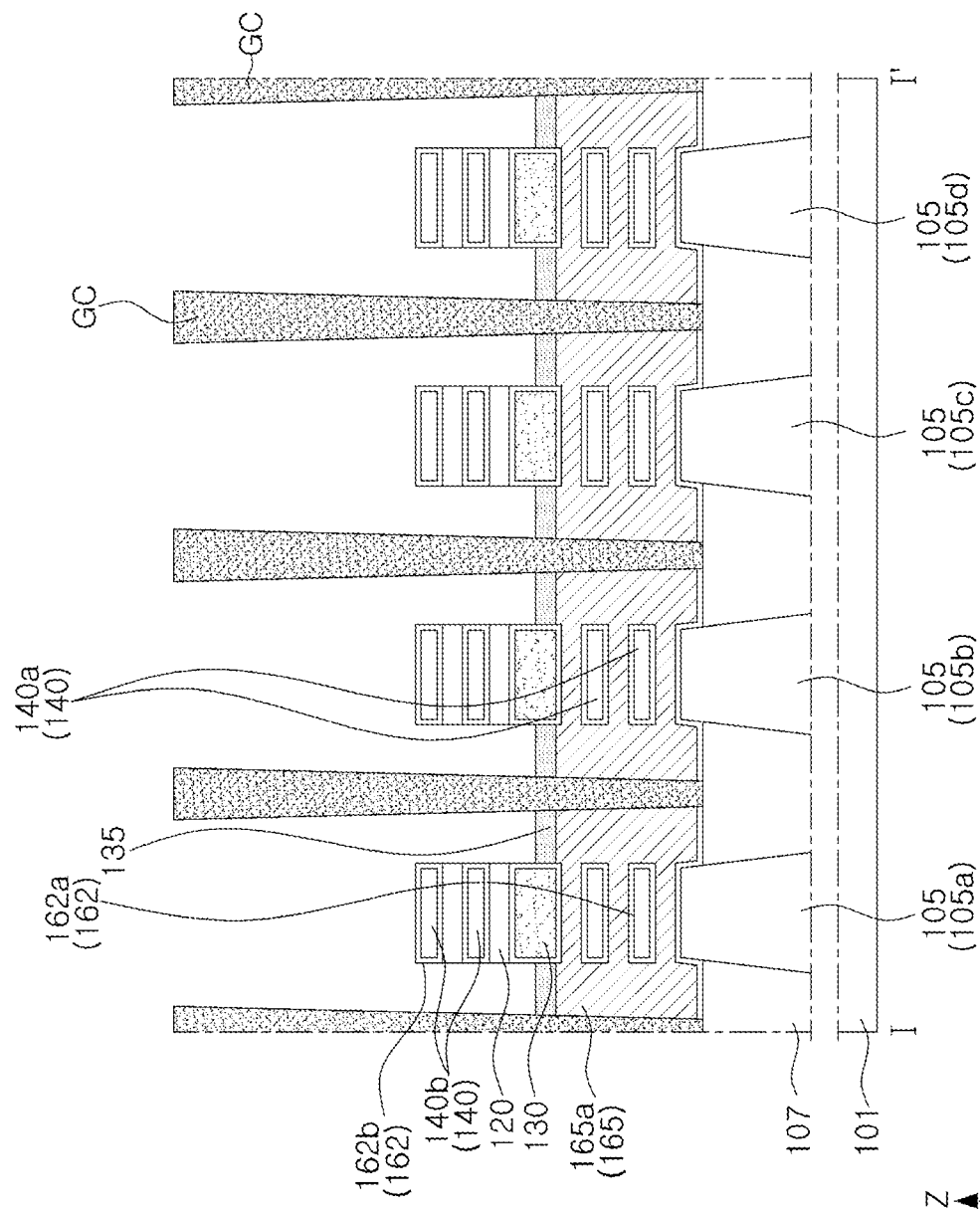

Referring to FIG. 8C, the dummy conductive material layers 165*ad* may be removed, and the sacrificial metal layers 120 may be formed. Similarly to that described with reference to FIG. 7C, the dummy conductive material layers 165*ad* may be removed, and the sacrificial metal layers 120 including a conductive material, different from the dummy conductive material layers 165*ad*, may be formed in the removed region.

Figure 8D:
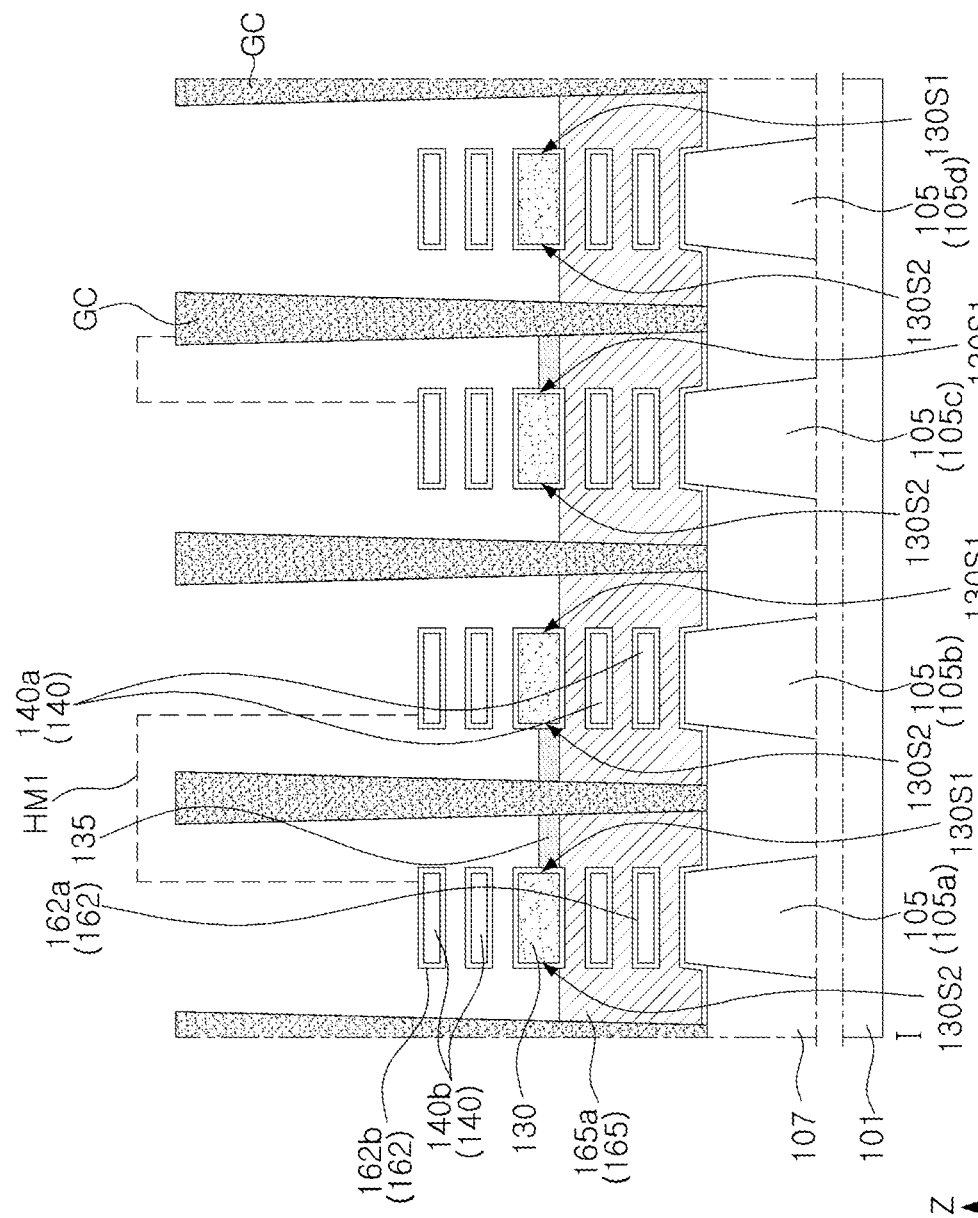

Referring to FIG. 8D, the insulating pattern 135 may be formed using a first mask HM1. Similarly to that described with reference to FIG. 7D, the insulating pattern 135 may be formed by removing a portion of the insulating material layer 135' by a patterning process using the first mask HM1. In an example embodiment, in the patterning process, the gate isolation patterns GC may not be etched, but according to embodiments, a portion of upper ends of the gate isolation patterns GC may be etched.

Figure 8E:
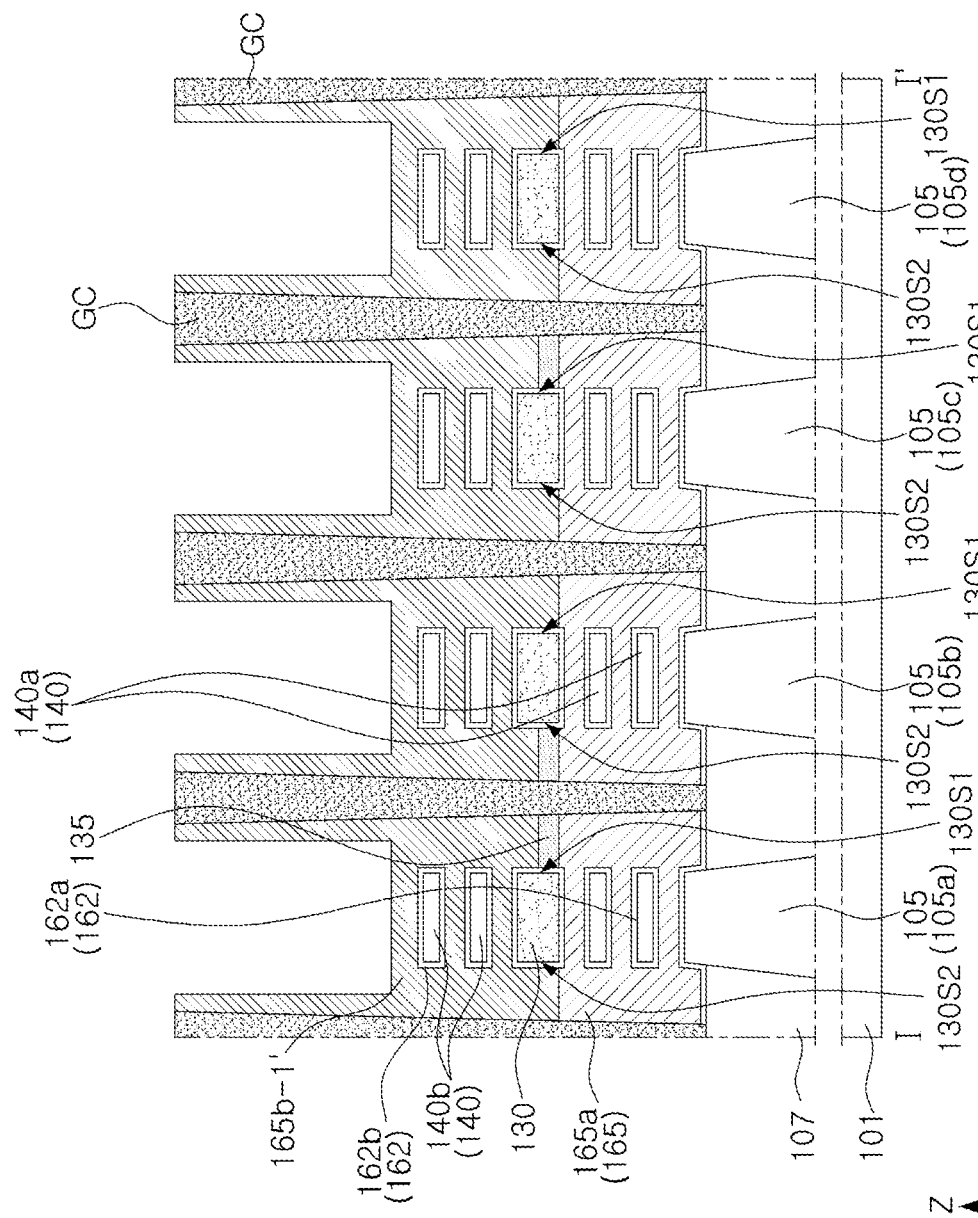

Referring to FIG. 8E, a first upper gate electrode 165*b*_1' may be formed. The first upper gate electrode 165*b*_1' may be formed by depositing a conductive material on the lower gate electrode 165*a* and the insulating pattern 135 to cover the upper channel layers 140*b* and the gate isolation patterns GC.

The first upper gate electrode 165*b*_1' may be formed after forming the gate isolation patterns GC, and may thus include a portion extending along exposed side surfaces of the gate isolation patterns GC. Therefore, the first upper gate electrode 165*b*_1' may include a protrusion.

Figure 8F:
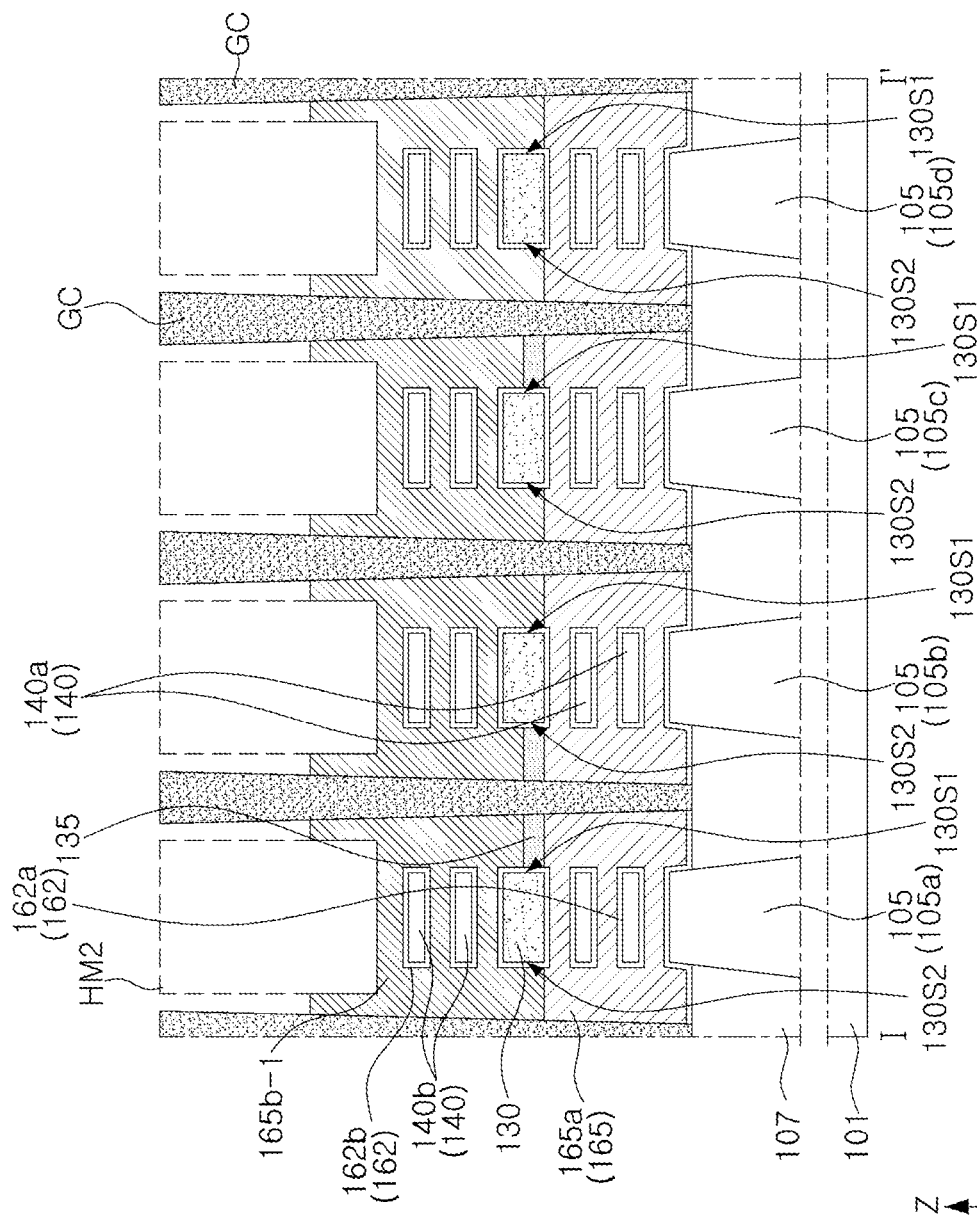

Referring to FIG. 8F, a portion of an upper end of the first upper gate electrode 165*b*_1' may be removed using a second mask HM2. The second mask HM2 may be formed between the gate isolation patterns GC, and a portion of the first upper gate electrode 165*b*_1' between the second mask HM2 and the gate isolation patterns GC may be removed to expose a portion of side surfaces of the gate isolation patterns GC. For example, a portion of the protrusion of the first upper gate electrode 165*b*_1' may be removed. In this operation, a level of an upper surface of the first upper gate electrode 165*b*_1' may be adjusted. After the portion of the upper end of the first upper gate electrode 165*b*_1' is removed, the second mask HM2 may be removed.

Figure 8G:
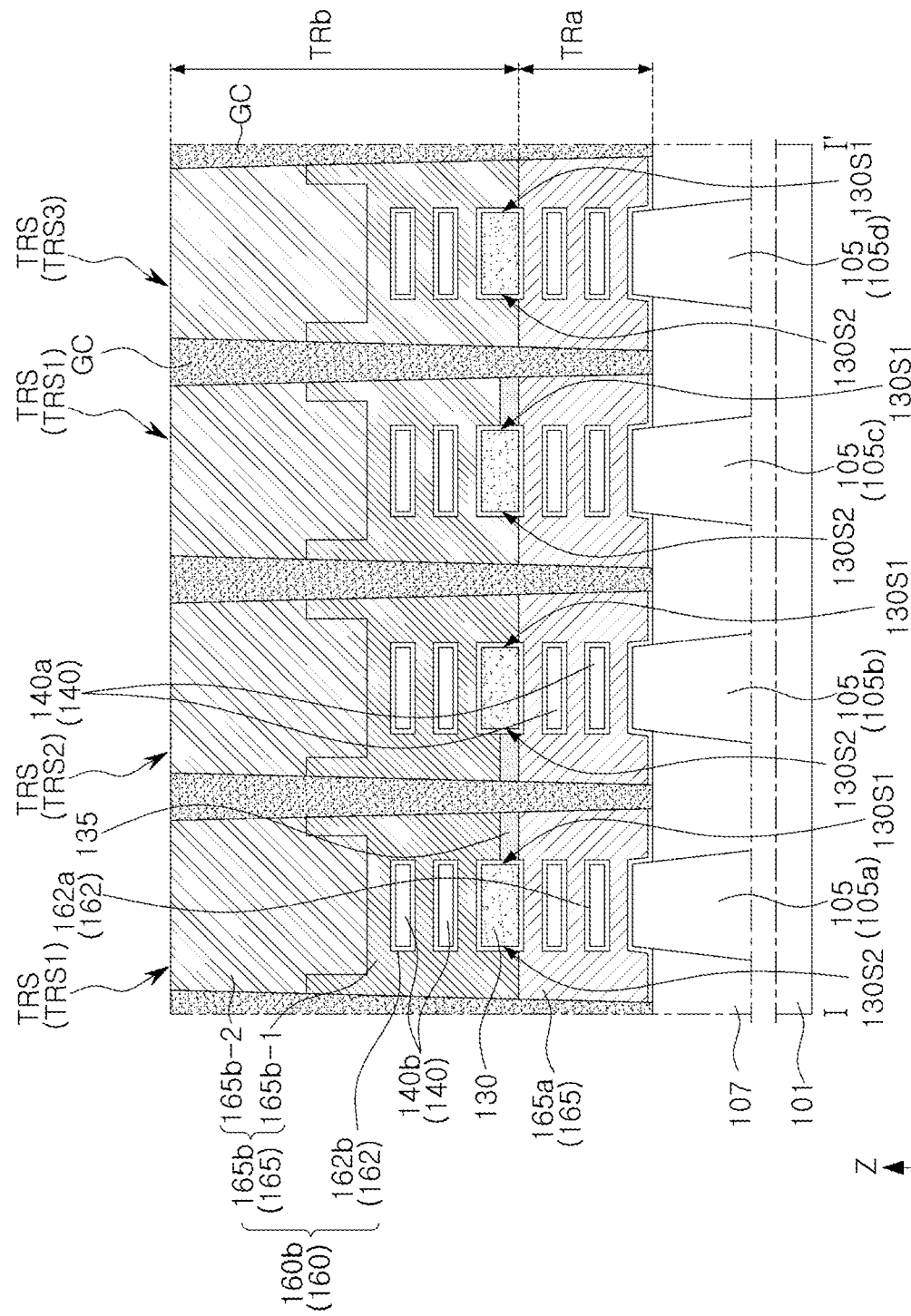

Referring to FIG. 8G, a second upper gate electrode 165*b*_2' may be formed. The second upper gate electrode 165*b*_2' may be formed by depositing a conductive material on the first upper gate electrode 165*b*_1' and performing a planarization process. The second upper gate electrode 165*b*_2' may cover a portion of side surfaces of the gate isolation patterns GC and the protrusion of the first upper gate electrode 165*b*_1', between adjacent gate isolation patterns GC.

Next, the upper interlayer insulating layers 183 and 184 and the upper interconnections 191 may be formed, and the lower interlayer insulating layers 185 and 186 and the lower interconnections 196 may be formed.

An aspect of embodiments provides a semiconductor device having improved electrical characteristics and reliability. That is, according to embodiments, an insulating pattern may be formed in a region between upper and lower gate electrodes to reduce or minimize parasitic capacitance between a contact plug and the gate electrodes while maintaining an electrical connection between the upper and lower gate electrodes, to provide a semiconductor device having improved electrical characteristics and reliability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
    a substrate;
    at least one active region extending in a first horizontal direction on the substrate;
    channel layers stacked on the at least one active region and spaced apart from each other, the channel layers including lower channel layers and upper channel layers on the lower channel layers;

an intermediate insulating layer between an uppermost one of the lower channel layers and a lowermost one of the upper channel layers;

a gate structure intersecting the at least one active region and the channel layers on the substrate, the gate structure extending in a second horizontal direction and including a gate electrode surrounding the channel layers, and the gate electrode including a lower gate electrode surrounding the lower channel layers and an upper gate electrode surrounding the upper channel layers;

an insulating pattern between the upper gate electrode and the lower gate electrode, the insulating pattern being on a first side of the intermediate insulating layer in the second horizontal direction;

source/drain regions on at least one side of the gate structure, the source/drain regions including lower source/drain regions connected to the lower channel layers and upper source/drain regions on the lower source/drain regions and connected to the upper channel layers; and a contact plug including a horizontal extension portion and a vertical extension portion connected to the horizontal extension portion, the horizontal extension portion being connected to each of the lower source/drain regions and extending in a horizontal direction parallel to the substrate, and the vertical extension portion extending in a vertical direction perpendicular to an upper surface of the substrate.

2. The semiconductor device as claimed in claim 1, wherein at least a portion of the insulating pattern is at a level equal to a level of at least a portion of the horizontal extension portion.

3. The semiconductor device as claimed in claim 1, wherein a first thickness of the intermediate insulating layer is greater than a second thickness of the insulating pattern.

4. The semiconductor device as claimed in claim 1, wherein:
the intermediate insulating layer includes at least one of silicon nitride, silicon oxynitride, and silicon carbonitride, and
the insulating pattern includes at least one of silicon oxide and silicon nitride.

5. The semiconductor device as claimed in claim 1, wherein:
an upper surface of the insulating pattern is in contact with the upper gate electrode, and
a lower surface of the insulating pattern is in contact with the lower gate electrode.

6. The semiconductor device as claimed in claim 1, wherein, in a region adjacent to a second side opposite to the first side of the intermediate insulating layer, the upper gate electrode has a region contacting the lower gate electrode.

7. The semiconductor device as claimed in claim 1, wherein a third thickness of the horizontal extension portion is thinner than a first thickness of the intermediate insulating layer.

8. The semiconductor device as claimed in claim 7, wherein the third thickness is substantially the same as a second thickness of the insulating pattern.

9. The semiconductor device as claimed in claim 7, wherein an upper surface of the horizontal extension portion is at a level lower than a level of an upper surface of the intermediate insulating layer.

10. The semiconductor device as claimed in claim 1, further comprising lower interconnections below the substrate,
wherein the at least one active region includes a plurality of active regions extending in parallel in the first horizontal direction, and
wherein the vertical extension portion is connected to the lower interconnections and passes through the substrate from the lower interconnections to extend between adjacent ones of the plurality of active regions.

11. The semiconductor device as claimed in claim 1, wherein the gate structure further includes a gate dielectric layer between the channel layers and the gate electrode, the gate dielectric layer covering at least one surface of the intermediate insulating layer.

12. The semiconductor device as claimed in claim 11, wherein the insulating pattern is spaced apart from the intermediate insulating layer by the gate dielectric layer.

13. The semiconductor device as claimed in claim 1, wherein the upper gate electrode includes:
a first upper gate electrode having a first portion covering an upper surface of the insulating pattern and an upper surface of the lower gate electrode, and a second portion covering the upper channel layers, and
a second upper gate electrode on the first upper gate electrode.

14. The semiconductor device as claimed in claim 13, wherein, in the first upper gate electrode, an upper end of the first portion is located at a level lower than a level of an upper end of the second portion.

15. A semiconductor device, comprising:
a substrate;
active regions extending parallel to each other on the substrate in a first horizontal direction;
transistor structures spaced apart from each other on the substrate in a second horizontal direction; and
gate isolation patterns physically separating the transistor structures,
wherein a first transistor structure of the transistor structures includes:
first channel layers spaced apart from each other and stacked on a first active region of the active regions, the first channel layers including lower channel layers and upper channel layers on the lower channel layers;
a first intermediate insulating layer between an uppermost one of the lower channel layers and a lowermost one of the upper channel layers;
a first gate structure intersecting the first active region and the first channel layers on the substrate, extending in the second horizontal direction, and including a first gate electrode surrounding the first channel layers;
a first insulating pattern between a first side of the first intermediate insulating layer in the second horizontal direction and the gate isolation patterns; and
first source/drain regions on at least one side of the first gate structure, the first source/drain regions including lower source/drain regions connected to the lower channel layers and upper source/drain regions connected to the upper channel layers on the lower source/drain regions.

16. The semiconductor device as claimed in claim 15, further comprising a contact plug connected to the lower source/drain regions of the first source/drain regions, the contact plug including a vertical extension portion extending in a vertical direction, perpendicular to an upper surface of the substrate, and a horizontal extension portion extending in a horizontal direction, parallel to the substrate, the horizontal extension portion of the contact plug having a portion overlapping the first insulating pattern in the first horizontal direction.

17. The semiconductor device as claimed in claim 15, wherein upper and lower surfaces of the first insulating pattern are in contact with the first gate electrode, one side surface of the first insulating pattern being in contact with the gate isolation patterns.

18. The semiconductor device as claimed in claim 15, wherein:
   the transistor structures further include a second transistor structure spaced apart from the first transistor structure in the second horizontal direction, a first gate isolation pattern among the gate isolation patterns being between the first and second transistor structures, and
   the second transistor structure includes:
      second channel layers spaced apart from each other and stacked on a second active region of the active regions, the second channel layers including lower channel layers and upper channel layers on the lower channel layers;
      a second intermediate insulating layer between an uppermost one of the lower channel layers and a lowermost one of the upper channel layers;
      a second gate structure intersecting the second active region and the second channel layers on the substrate, extending in the second horizontal direction, and including a second gate electrode surrounding the second channel layers;
      a second insulating pattern between a second side of the second intermediate insulating layer, opposite to the first side, in the second horizontal direction and the gate isolation patterns; and
      second source/drain regions on at least one side of the second gate structure, the second source/drain regions including lower source/drain regions connected to the lower channel layers and upper source/drain regions connected to the upper channel layers on the lower source/drain regions.

19. The semiconductor device as claimed in claim 15, wherein:
   the transistor structures further include a second transistor structure spaced apart from the first transistor structure in the second horizontal direction, a first gate isolation pattern among the gate isolation patterns being between the first and second transistor structures,
   the second transistor structure includes:
      second channel layers spaced apart from each other and stacked on a second active region of the active regions, the second channel layers including lower channel layers and upper channel layers on the lower channel layers;
      a second intermediate insulating layer between an uppermost one of the lower channel layers and a lowermost one of the upper channel layers;
      a second gate structure intersecting the second active region and the second channel layers on the substrate, extending in the second horizontal direction, and including a second gate electrode surrounding the second channel layers; and
      second source/drain regions on at least one side of the second gate structure, the second source/drain regions including lower source/drain regions connected to the lower channel layers and upper source/drain regions connected to the upper channel layers on the lower source/drain regions, and
   the second gate electrode entirely surrounds the second intermediate insulating layer.

20. A semiconductor device, comprising:
   a substrate;
   an active region extending on the substrate in a first horizontal direction;
   channel layers stacked on the active region to be spaced apart from each other, the channel layers including lower channel layers and upper channel layers on the lower channel layers;
   a gate structure intersecting the active region and the channel layers on the substrate, extending in a second horizontal direction, and including a gate electrode surrounding the channel layers, the gate electrode including a lower gate electrode surrounding the lower channel layers and an upper gate electrode surrounding the upper channel layers;
   an insulating pattern between the upper gate electrode and the lower gate electrode;
   source/drain regions on at least one side of the gate structure, and including lower source/drain regions connected to the lower channel layers and upper source/drain regions connected to the upper channel layers on the lower source/drain regions; and
   a contact plug including a vertical extension portion extending in a vertical direction, perpendicular to an upper surface of the substrate, and a horizontal extension portion connected to each of the lower source/drain regions and extending in a horizontal direction, parallel to the substrate,
   wherein the lower gate electrode has a portion contacting the upper gate electrode,
   wherein the insulation pattern does not overlap the channel layers in the vertical direction, and
   wherein at least a portion of the insulation pattern is at a level equal to a level of at least a portion of the horizontal extension portion.

* * * * *